United States Patent
Hatano et al.

(10) Patent No.: US 11,997,930 B2
(45) Date of Patent: May 28, 2024

(54) PIEZOELECTRIC ELEMENT AND METHOD FOR MANUFACTURING SAME

(71) Applicant: TAIYO YUDEN CO., LTD., Tokyo (JP)

(72) Inventors: Keiichi Hatano, Takasaki (JP); Koichi Tsukagoshi, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 673 days.

(21) Appl. No.: 17/181,732

(22) Filed: Feb. 22, 2021

(65) Prior Publication Data

US 2021/0305489 A1 Sep. 30, 2021

(30) Foreign Application Priority Data

Mar. 27, 2020 (JP) .................. 2020-057954

(51) Int. Cl.
*H10N 30/853* (2023.01)
*H10N 30/053* (2023.01)
*H10N 30/097* (2023.01)
*H10N 30/50* (2023.01)
*H10N 30/87* (2023.01)

(52) U.S. Cl.
CPC ....... *H10N 30/8536* (2023.02); *H10N 30/053* (2023.02); *H10N 30/097* (2023.02); *H10N 30/50* (2023.02); *H10N 30/878* (2023.02)

(58) Field of Classification Search
CPC ............. H10N 30/8536; H10N 30/878; H10N 30/053; H10N 30/097; H10N 30/50
See application file for complete search history.

(56) References Cited

U.S. PATENT DOCUMENTS

| 9,614,142 | B2* | 4/2017 | Ikemi ................... H10N 30/877 |
| 10,446,737 | B2* | 10/2019 | Hatano .................. H10N 30/06 |
| 2008/0290316 | A1 | 11/2008 | Katayama et al. |
| 2013/0320815 | A1 | 12/2013 | Hatano et al. |

FOREIGN PATENT DOCUMENTS

| JP | 2016175824 A | 10/2016 |
| JP | 2017163055 A | 9/2017 |
| WO | 2007094115 A1 | 8/2007 |
| WO | 2012086449 A1 | 6/2012 |

* cited by examiner

*Primary Examiner* — J. San Martin
(74) *Attorney, Agent, or Firm* — Law Office of Katsuhiro Arai

(57) ABSTRACT

Form internal electrodes with a metal whose silver content is 80 percent by mass or higher, and also constitute piezoelectric ceramic layers with a piezoelectric ceramic whose primary component is an alkaline niobate having a perovskite structure and which contains at least one type of alkaline earth metal selected from calcium and barium, as well as silver, wherein the total content of the alkaline earth metal is 0.2 percent by mol or higher but lower than 2.0 percent by mol when the element content in the B sites of the alkaline niobate represents 100 percent by mol, and wherein the piezoelectric ceramic layers each contain at least one sintered grain 41 that has silver-segregated regions 42 inside and the silver-segregated regions 42 have a long diameter of 10 nm or smaller.

13 Claims, 5 Drawing Sheets

PIEZOELECTRIC ELEMENT AND METHOD FOR MANUFACTURING SAME

CROSS-REFERENCE TO RELATED APPLICATIONS

The present application claims priority to Japanese Patent Application No. 2020-057954, filed Mar. 27, 2020, the disclosure of which is incorporated herein by reference in its entirety including any and all particular combinations of the features disclosed therein.

BACKGROUND

Field of the Invention

The present invention relates to a piezoelectric element and a method for manufacturing the same.

Description of the Related Art

A piezoelectric element is an electronic component having a structure in which a ceramic with piezoelectricity (a piezoelectric ceramic) is sandwiched between a pair of electrodes. Here, "piezoelectricity" refers to a property that allows for interconversion of electrical energy and mechanical energy.

Utilizing the aforementioned property of piezoelectric ceramics, piezoelectric elements can convert the voltage impressed between a pair of electrodes to mechanical energy, such as pressure or vibration, and thereby move themselves or other objects. On the other hand, piezoelectric elements can also convert mechanical energy, such as vibration or pressure, to electrical energy and retrieve the electrical energy as voltage between a pair of electrodes.

When converting the voltage applied between electrodes to mechanical vibration, piezoelectric elements can generate vibrations in a wide range of frequencies. To be specific, they can generate vibrations, for example, in a frequency band of approx. 1 to 100 Hz representing the so-called "low-frequency sounds," in a frequency band of approx. 20 Hz to 20 kHz representing the sounds perceptible by humans, in a frequency band of 20 kHz to several GHz representing the so-called "ultrasonic waves," and in a frequency band of around several to several tens of GHz representing electromagnetic waves. This is why piezoelectric elements are used in speakers and other vibration components. On the other hand, piezoelectric elements can also sense vibrations in the various frequency bands mentioned above and generate voltages in a wide range of corresponding frequency bands.

Known structures of piezoelectric elements include one characterized by electrodes formed only on the piezoelectric ceramic surface, and the so-called "multilayer piezoelectric element" type comprising a stack of multiple piezoelectric ceramic layers sandwiched between internal electrodes. Multilayer piezoelectric elements can achieve large displacements in the stacking direction of multiple piezoelectric ceramic layers, and thus can be utilized for actuators, etc., for example. Typically, multilayer piezoelectric elements are manufactured through simultaneous firing of piezoelectric ceramic layers and internal electrodes.

Widely used as piezoelectric ceramics that constitute these piezoelectric elements, are ones whose primary component is lead zirconate titanate ($Pb(Zr,Ti)O_3$, PZT) or solid solution thereof. Because PZT-based piezoelectric ceramics have high Curie temperatures, they can be used to obtain piezoelectric elements that are usable even in a high-temperature environment. Also, these piezoelectric ceramics have an advantage in that they have high electromechanical coupling coefficients and thus can be used to obtain piezoelectric elements that allow for efficient conversion of electrical energy and mechanical energy. Furthermore, these piezoelectric ceramics have another advantage in that, in appropriately selected compositions, they can be fired at temperatures below 1000° C. and thus can lower the manufacturing cost of piezoelectric elements. Particularly in the case of the aforementioned multilayer piezoelectric elements, these piezoelectric ceramics allow for use of low-melting-point materials containing lower quantities of platinum, palladium, and other expensive ingredients, for the internal electrodes that are simultaneously fired with the piezoelectric ceramics, which produces a significant cost reduction effect.

However, PZT-based piezoelectric ceramics present a problem in that they contain lead, which is a toxic substance, and therefore a need exists for lead-free piezoelectric ceramic compositions to replace PZT-based piezoelectric ceramics.

Lead-free piezoelectric ceramics based on alkaline niobates (($Li$, $Na$, $K)NbO_3$), bismuth-sodium titanate (($Bi_{0.5}Na_{0.5})TiO_3$, BNT), bismuth layered compounds, tungsten bronze, and various other compositions, have been heretofore reported. Among these, alkaline niobate-based piezoelectric ceramics have high Curie temperatures as well as relatively high electromechanical coupling coefficients, and are thus drawing attention as alternatives to their PZT-based counterparts (Patent Literature 1).

Alkaline niobate-based piezoelectric ceramics have silver added to them, in addition to the primary components of alkali metal and niobium, for the purpose of lowering the sintering temperature or improving properties (Patent Literatures 2 to 4).

For example, Patent Literature 2 discloses that, by adding $Ag_2O$ to an alkaline niobate-based compound powder, precipitation of $Li_3NbO_4$ during firing can be promoted and the firing temperature can be lowered to 1000° C. or so.

Also, Patent Literature 3 discloses that piezoelectric ceramics constituted by sintered alkali-containing niobate-based perovskite compositions having Ag segregated in the voids, are suitable for use at high temperature.

Furthermore, Patent Literature 4 discloses that alkaline niobate-based piezoelectric ceramics, when they contain alkaline earth metals and silver, allow for low-cost manufacturing of piezoelectric elements offering both high reliability and good piezoelectric characteristics.

BACKGROUND ART LITERATURES

[Patent Literature 1] International Patent Laid-open No. 2007/094115
[Patent Literature 2] International Patent Laid-open No. 2012/086449
[Patent Literature 3] Japanese Patent Laid-open No. 2016-175824
[Patent Literature 4] Japanese Patent Laid-open No. 2017-163055

SUMMARY

Technological advancement in recent years is creating a need for further size reduction of, and performance enhancement to, piezoelectric elements. Reducing the size of a piezoelectric element inevitably decreases the volume of the piezoelectric ceramic in the element while also reducing the distance between its electrodes, which tends to lower the piezoelectric characteristics and electrical resistance of the piezoelectric element. This makes it difficult to retain the displacement of the piezoelectric element and the voltage it generates, and to ensure reliability while retaining the insulating property between the electrodes.

Additionally, in regard to multilayer piezoelectric elements, metals with a high content percentage of Ag are often used as internal electrodes. This raises a concern that Ag may diffuse into the piezoelectric ceramic during firing to lower the electrical resistance of the piezoelectric ceramic, thereby impairing the reliability of the multilayer piezoelectric element.

In Patent Literature 2, precipitation of $Li_3NbO_4$ is utilized to lower the firing temperature of the piezoelectric ceramic, which is understood to suppress the quantity of Ag that diffuses from the internal electrodes when the piezoelectric ceramic is made into a multilayer piezoelectric element. However, there is a concern that the electrical resistance of the piezoelectric ceramic may drop depending on the mode of precipitation of $Li_3NbO_4$ as it has conductivity.

Also, as described in Patent Literature 3, inhibiting Ag in the internal electrodes from diffusing by causing it to segregate in the voids within the sintered body results in Ag segregations at the grain boundaries in the piezoelectric ceramic. In a multilayer piezoelectric element whose internal electrodes are distanced by 50 μm or less, these Ag segregations at the grain boundaries are a likely cause of electrical continuity between the electrodes, which can lead to a high defect rate even when the segregations are approx. 0.1 μm in size.

In Patent Literature 4, diffusion of Ag from the internal electrodes is utilized to fine-tune the sizes of piezoelectric ceramic grains, and a multilayer piezoelectric element of excellent properties is obtained when the content percentage of Ag in the internal electrodes is no higher than around 70 percent by mass. However, adjusting the silver content in the internal electrodes to 80 percent by mass or higher for the purpose of lowing the cost further may sometimes cause the internal electrodes to liquify during firing, the result of which is that a multilayer piezoelectric element can no longer be obtained.

Accordingly, an object of the present invention is to provide a multilayer piezoelectric element using an alkaline niobate-based piezoelectric ceramic at low cost. It should be noted that any discussion of problems and solutions in relation to the related art has been included in this disclosure solely for the purposes of providing a context for the present invention, and should not be taken as an admission that any or all of the discussion was known at the time the invention was made. Further, the present invention is distinguished from the above-discussed related art, and in order to clarify the distinctions, any elements taught in the related art can expressly be excluded from optional elements otherwise usable in the present invention, and to that extent, the disclosure of the related art is herein incorporated by reference.

Having conducted various studies to achieve the aforementioned object, the inventor of the present invention found that the object could be achieved by using an alkaline niobate-based piezoelectric ceramic that contains silver and at least one type of alkaline earth metal selected from calcium and barium, and by causing Ag to segregate in the piezoelectric ceramic not at the grain boundaries, but inside the grains instead, and eventually completed the present invention.

To be specific, an aspect of the present invention to achieve the aforementioned object is a multilayer piezoelectric element characterized in that it comprises: piezoelectric ceramic layers that are: constituted by a piezoelectric ceramic whose primary component is an alkaline niobate having a perovskite structure and which contains silver and at least one type of alkaline earth metal selected from calcium and barium, wherein the total content of the alkaline earth metal is 0.2 percent by mol or higher but lower than 2.0 percent by mol when the element content in the B sites of the alkaline niobate represents 100 percent by mol; and each piezoelectric ceramic layer containing at least one sintered grain that has silver-segregated regions inside, wherein the silver-segregated regions have a long diameter of 10 nm or smaller; and internal electrodes that are placed between the piezoelectric ceramic layers and formed by a metal whose silver content is 80 percent by mass or higher.

Additionally, another aspect of the present invention is a method for manufacturing a multilayer piezoelectric element, which includes: preparing green sheets that contain a powder of an alkaline niobate having a perovskite structure, as well as an organic binder, while also containing at least one type of alkaline earth metal selected from calcium and barium, wherein the total content of the alkaline earth metal is 0.2 percent by mol or higher but lower than 2.0 percent by mol when the element content in the B sites of the alkaline niobate represents 100 percent by mol; placing, on the green sheets, precursors to internal electrodes that contain a metal whose silver content is 80 percent by mass or higher; stacking the green sheets on which the precursors to internal electrodes have been placed, to produce a laminated body; and firing the laminated body to obtain a fired body constituted by internal electrodes provided between sintered body layers whose primary component is the alkaline niobate and which contains at least one type of alkaline earth metal selected from calcium and barium, as well as silver, while also each (sintered body layer) containing at least one sintered grain that has silver-segregated regions inside, wherein the silver-segregated regions have a long diameter of 10 nm or smaller.

According to the present invention, a multilayer piezoelectric element using an alkaline niobate-based piezoelectric ceramic can be provided at low cost.

DESCRIPTION OF THE SYMBOLS

Figure 1:
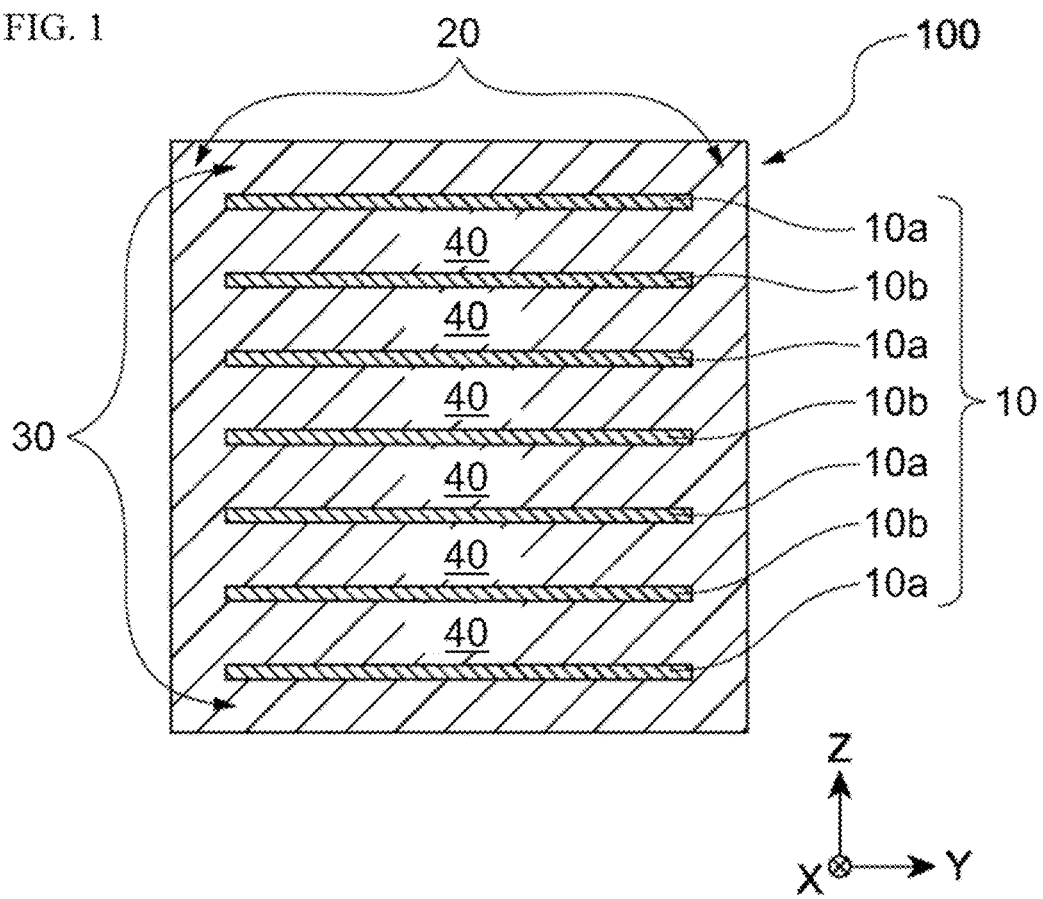
FIG. 1 is a cross-sectional view showing the structure of the multilayer piezoelectric element pertaining to an aspect of the present invention.

100 Multilayer piezoelectric element
10 Internal electrode
20 Side margin part
30 Cover part
40 Piezoelectric ceramic layer
41 Sintered grain
42 Silver-segregated region

DETAILED DESCRIPTION OF EMBODIMENTS

The constitutions as well as operations and effects of the present invention are explained below, together with the technical concepts, by referring to the drawings. It should be noted, however, that the mechanisms of operations include estimations, and whether they are correct or wrong does not limit the present invention in any way. Also, of the components in the aspects below, those components described in an aspect but not in another aspect are alternative, additional, or optional components and can be positively excluded from the another aspect or can be replaced with any components equivalent thereto including those explicitly, necessarily, or inherently disclosed herein. It should be noted that a description of numerical range (description of two values connected by "to") is interpreted to include the described values as the lower limit and the upper limit in some embodiments, and in other embodiments, the lower limit and/or the upper limit can be exclusive in the range.

[Multilayer Piezoelectric Element]

The multilayer piezoelectric element 100 pertaining to an aspect of the present invention (hereinafter also referred to simply as the "first aspect") has a structure in which internal electrodes 10 are placed between piezoelectric ceramic layers 40, as shown in the schematic cross-sectional view in FIG. 1. And, the internal electrodes 10 are formed by a metal whose silver content is 80 percent by mass or higher. It should be noted that, among the internal electrodes 10 shown in FIG. 1, those having the same letter ("a" or "b") represent electrodes of the same polarity. Also, the piezoelectric ceramic layers 40 are constituted by a piezoelectric ceramic whose primary component is an alkaline niobate having a perovskite structure and which contains at least one type of alkaline earth metal selected from calcium and barium, as well as silver, wherein the total content of the alkaline earth metal is 0.2 percent by mol or higher but lower than 2.0 percent by mol when the element content in the B sites of the alkaline niobate represents 100 percent by mol, while also each (piezoelectric ceramic layer) containing at least one sintered grain that has silver-segregated regions inside, wherein the silver-segregated regions have a long diameter of 10 nm or smaller.

The internal electrodes 10 are formed by a metal whose silver content is 80 percent by mass or higher. By adjusting the silver content to 80 percent by mass or higher, the use quantity of platinum, palladium, and other expensive metals can be reduced to keep the manufacturing cost of the piezoelectric element low. Also, an increase in the percentage of silver offering excellent conductivity leads to a lower electrical resistivity of the internal electrodes 10 and reduced electrical loss of the piezoelectric element in which they are used. Examples of metals whose silver content is 80 percent by mass or higher include silver-palladium alloy and silver. The silver content in the metal constituting the internal electrodes 10 is preferably 85 percent by mass or higher, or more preferably 90 percent by mass or higher.

The silver content in the metal constituting the internal electrodes 10 can be confirmed by conducting an element analysis of the internal electrodes 10 using any of various measuring equipment, and then calculating the mass percentage of silver relative to all detected elements. Examples of measuring equipment that can be used include: an energy dispersive X-ray spectrometer (EDS) or wavelength dispersive X-ray spectrometer (WDS) installed on a scanning electron microscope (SEM) or transmission electron microscope (TEM); an electron probe micro-analyzer (EPMA); and a laser ablation inductively coupled plasma mass spectrometer (LA-ICP-MS), and the like. The measured values may slightly vary depending on the type of device used for measurement, and in this disclosure, if a value satisfying the requirement set forth in this disclosure is obtained by properly using any of the listed devices or equivalent thereto, the value can be used as a representative value. Further, in this disclosure, when sampling a test sample for measurement or confirmation, such a test sample is prepared by randomly selecting an object or target (unless stated otherwise) so that the object or target can be used as a representative sample.

The piezoelectric ceramic layers 40, whose primary component is an alkaline niobate, contain at least one type of alkaline earth metal selected from calcium and barium, as well as silver.

Figure 2:
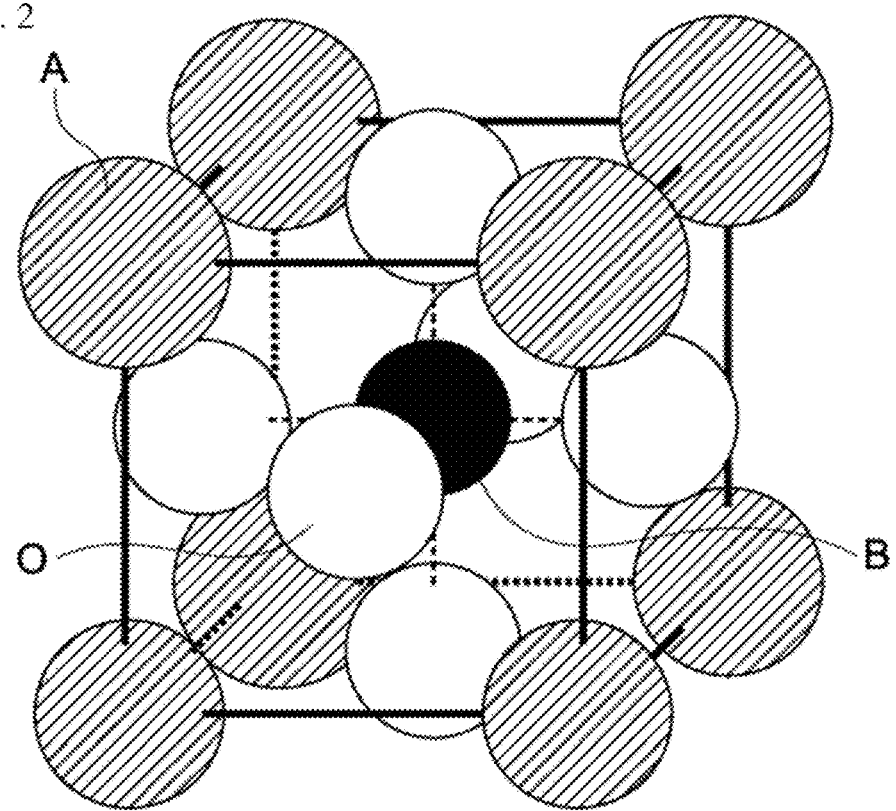
FIG. 2 is a perspective view showing a unit lattice model of perovskite structure.

The alkaline niobate, which is a primary component, is an oxide having a perovskite structure that contains, as its constituent elements, at least one type of alkali metal selected from lithium, sodium, and potassium, as well as niobium. Here, the perovskite structure is a crystalline structure having A sites positioned at the apexes of a unit lattice, O sites positioned at the face centers of the unit lattice, and a B site positioned in the octahedron whose apexes correspond to the O sites, as shown in FIG. 2. In the alkaline niobate in this aspect, an alkali metal ion is positioned in the A site, a niobium ion is positioned in the B site, and an oxide ion is positioned in the O site, respectively. Additionally, various ions other than those mentioned above may be contained in the respective sites.

The piezoelectric ceramic layers 40 contain at least one type of alkaline earth metal selected from calcium and barium. This achieves high piezoelectricity and electrical insulating property, allowing the piezoelectric element to have excellent properties. From the viewpoint of enhancing these actions, preferably any contained alkaline earth metal exists, at least partially, as a solid solution in the A sites of the perovskite structure, in the alkaline niobate being a primary component. In this case, an alkaline niobate containing such solid solution of alkaline earth metal serves as a primary component of the piezoelectric ceramic layers 40.

The total content of at least one type of alkaline earth metal selected from calcium and barium, in the piezoelectric ceramic layers 40, is 0.2 percent by mol or higher but lower than 2.0 percent by mol when the element content in the B sites of the alkaline niobate represents 100 percent by mol. Adjusting the total content to 0.2 percent by mol or higher makes sintered grains constituting the piezoelectric ceramic layers 40 small and makes the piezoelectric ceramic layers 40 dense, and allows them to manifest excellent piezoelectric characteristics. From the viewpoint of enhancing this action and effect, the total content is preferably 0.3 percent by mol or higher, or more preferably 0.5 percent by mol or higher. On the other hand, adjusting the total content to lower than 2.0 percent by mol improves the electrical insulating property of the piezoelectric ceramic layers 40, making the piezoelectric element usable under a high electric field while also extending its lifespan. In this respect, the total content is preferably lower than 1.0 percent by mol, or more preferably 0.8 percent by mol or lower.

The element content in the B sites of the alkaline niobate, and the content of the alkaline earth metal, are each determined from the measured results of element ratios according to the method for confirming the composition formula as described below.

The piezoelectric ceramic layers 40 may contain strontium and other alkaline earth metals, other than calcium and barium. Even when contained in relatively small quantities, however, alkaline earth metals other than calcium and barium would make it difficult to obtain a dense ceramic, and therefore preferably they are not contained in any substantial way. Here, "not contained in any substantial way" (or "substantially not contained") means that they are not contained beyond the quantities that will inevitably mix in during the manufacturing process, such as quantities contained in the materials as impurities and quantities that will mix in when intermediate products are handled (e.g., remaining quantities despite the costly and/or technologically reasonable attempt to exclude such an element in the manufacturing process and associated process, provided that such quantities do not substantially compromise or affect the properties of a final product in any respect). In some embodiments, the piezoelectric ceramic layers consist essentially of calcium and barium as alkaline earth metals or can expressly exclude one or more optional alkali metal(s) or any optional element(s) listed in this disclosure.

The piezoelectric ceramic layers 40 contain silver. This leads to a manifestation of excellent piezoelectric characteristics. Silver in the piezoelectric ceramic layers 40 primarily exists as a solid solution in the A sites of the alkaline niobate having a perovskite structure as described above, or forms silver-segregated regions as described below. If silver exists as a solid solution in the A sites of the alkaline niobate, an alkaline niobate containing such solid solution serves as a primary component of the piezoelectric ceramic layers 40.

The alkaline niobate, which is a primary component of the piezoelectric ceramic layers 40, is preferably one expressed by Composition Formula (1) below from the viewpoint of allowing excellent piezoelectric characteristics to manifest, and also from the viewpoint of obtaining a piezoelectric element that will have a long lifespan when used under a high electric field:

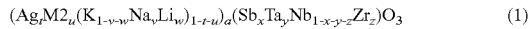

$$(Ag_t M2_u(K_{1-v-w}Na_v Li_w)_{1-t-u})_a(Sb_x Ta_y Nb_{1-x-y-z}Zr_z)O_3 \qquad (1)$$

It should be noted that, in the formula, M2 represents the aforementioned alkaline earth metal. Also, t, u, v, w, x, y, z, and a represent values satisfying the inequalities expressed by $0.005 < t \leq 0.05$, $0.002 \leq u < 0.02$, $0.007 < t+u < 0.07$, $0 \leq v \leq 1$, $0.02 < w \leq 0.1$, $0.02 < v+w \leq 1$, $0 \leq x \leq 0.1$, $0 \leq y \leq 0.4$, $0 \leq z \leq 0.02$, and $1 < a \leq 1.1$, respectively.

Here, the fact that the piezoelectric ceramic layers 40 are constituted by an alkaline niobate expressed by the aforementioned composition formula, as a primary component, is confirmed by employing an X-ray diffractometer (XRD) that uses the Cu—Kα line to measure diffraction line profiles on a piezoelectric ceramic layer 40 exposed on the surface of the multilayer piezoelectric element 100, or a powder obtained by pulverizing the multilayer piezoelectric element 100, and then confirming that the percentage of the maximum diffraction line intensity in any diffraction profile derived from structures other than the perovskite structure, relative to the maximum diffraction line intensity in the profile derived from the perovskite structure, is 10 percent or lower, followed by a measurement of the ratio of each element contained in the piezoelectric ceramic layers 40 using a high-frequency inductively coupled plasma (ICP) emission spectrometer, ion chromatographic apparatus or X-ray fluorescence (XRF) spectrometer, and then by a confirmation that the measured result matches the corresponding ratio in the composition formula. It should be noted that, when XRD measurement is performed on a piezoelectric ceramic layer 40 exposed on the surface of the multilayer piezoelectric element 100, the method of exposure is not limited in any way and a method whereby the piezoelectric element is cut or ground may be adopted, for example. Also, when XRD measurement is performed on a powder obtained by pulverizing the multilayer piezoelectric element 100, the means for pulverization is not limited in any way, either, and a hand mill (mortar and pestle), etc., may be utilized. Furthermore, when XRD measurement is performed on a powder obtained by pulverizing the multilayer piezoelectric element 100, peaks attributable to the metal constituting the internal electrodes 10 will also be detected and must therefore be removed prior to the aforementioned confirmation.

In the alkaline niobate expressed by Composition Formula (1) above, Zr acts to inhibit a drop in electrical resistance in the sintered grains. Specifically, in the alkaline niobate, the alkaline earth metal M2 has formed a solid solution by replacing the alkali metal positioned in the A sites of the perovskite structure, resulting in a state of excessive positive charge and consequently a likelihood of oxygen deficiency (interstitial oxygen) in order to balance the charge. This oxygen deficiency becomes a factor of conduction under a high-temperature condition and causes the electrical resistance of the sintered grains to drop. However, the presence of Zr having a lower positive charge as a solid solution in the B site of the perovskite structure inhibits oxygen deficiency from occurring and the electrical resistance from dropping. From the viewpoint of this action of Zr, preferably its content is roughly equal to that of the alkaline earth metal M2. If the quantity of Zr is too small compared to M2, sufficient charge compensation will not occur. If, by contrast, the quantity of Zr is too large compared to M2, lack of positive charge will trigger oxygen deficiency and cause the electrical resistance to drop instead.

The piezoelectric ceramic layers 40 each contain at least one sintered grain that has silver-segregated regions inside, wherein the silver-segregated regions have a long diameter of 10 nm or smaller. This allows the electrical insulating property of the piezoelectric element to increase. The explanation for the above is that highly conductive silver no longer exists between the sintered grains that tend to create pathways for current conduction under high voltage. If the silver-segregated regions have a long diameter exceeding 10 nm, conduction pathways may form inside the sintered grains and cause the electrical insulating property to drop, or the percentage of areas not exhibiting piezoelectricity may increase and cause the piezoelectric characteristics to drop. From the viewpoint of inhibiting the piezoelectric characteristics from dropping, the long diameter is preferably 8 nm or smaller, or more preferably 5 nm or smaller.

Confirmation of presence or absence of silver-segregated regions and measurement of their long diameters uses a combination of morphological observation based on a transmission electron microscope (TEM) and characteristic X-ray measurement based on an energy dispersive X-ray spectrometer (EDS). The specific measurement procedure is explained below.

First, a thin piece of approx. 100 nm in thickness, which includes a piezoelectric ceramic layer 40, is obtained from the multilayer piezoelectric element 100 using an ion beam, etc. Next, the obtained thin piece is observed with a TEM. At this time, the electron beam irradiated onto the thin piece is converged to a diameter of 1 nm or smaller because the silver-segregated regions to be confirmed have a long diameter of 10 nm or smaller. If, as a result of observation, any region of approx. 10 nm or smaller that appears whiter (brighter) compared to the rest is confirmed inside any of the sintered grains forming the piezoelectric ceramic layer 40, EDS measurement is performed on the interior of the region and also on the region on its exterior side that appears black (dark). Here, the measurement conditions are determined so that the intensity of the detected potassium K line (K-K line) becomes at least 300 counts. Also, the EDS measurement of the exterior-side region is performed at a position sufficiently away (as far away as possible or reasonable) in a randomly selected direction from the aforementioned region that appears white or from the outer periphery of the sintered grain. Next, the ratio of the intensity of the Ag-L line to the intensity of the K-K line ($I_{Ag-L}/I_{K-K}$) is calculated for each region from the measured results. Then, when the value of $I_{Ag-L}/I_{K-K}$ in the aforementioned region is at least twice that in the region on its exterior side, this region is determined to be a silver-segregated region and the maximum length of a line segment that can be drawn inside the region on the TEM image is taken as the long diameter of the silver-segregated region. It should be noted that presence of a silver-segregated region of 10 nm or smaller in long diameter is determined even when the aforementioned TEM observation confirms a location that appears white inside a sintered grain, and the value of $I_{Ag-L}/I_{K-K}$ in this location is found at least twice that in the exterior-side region as a result of EDS measurement, but the location is too small to determine the length of a line segment that can be drawn inside it.

Figure 3:
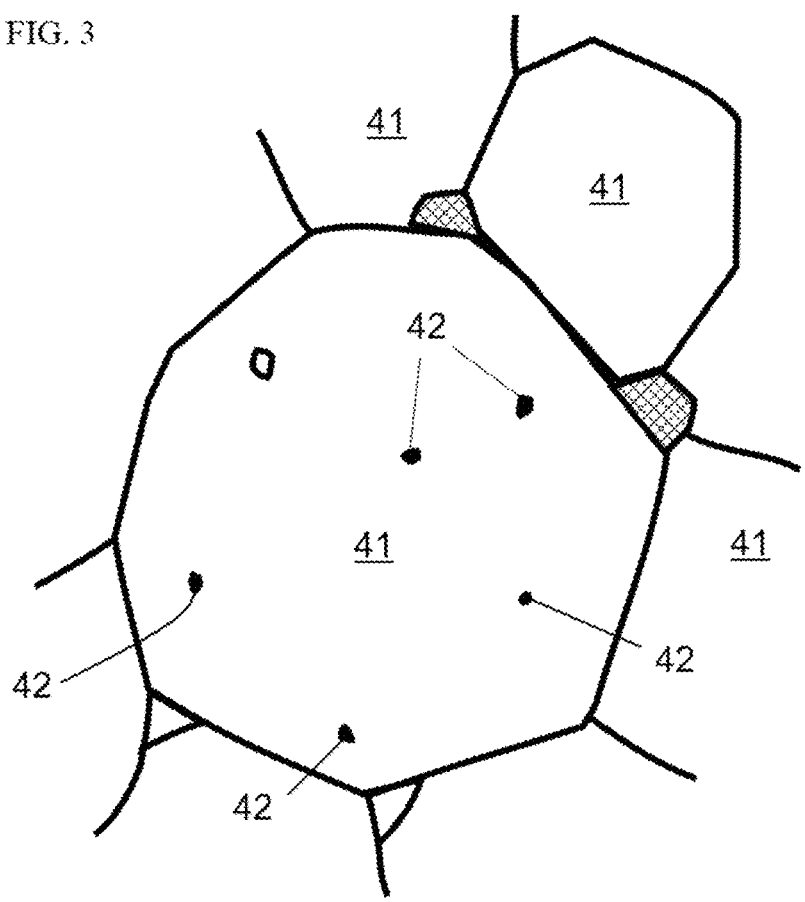
FIG. 3 is a sketch based on a transmission electron microscope (TEM) image of a piezoelectric ceramic layer constituting the multilayer piezoelectric element pertaining to an aspect of the present invention.
Figure 4:
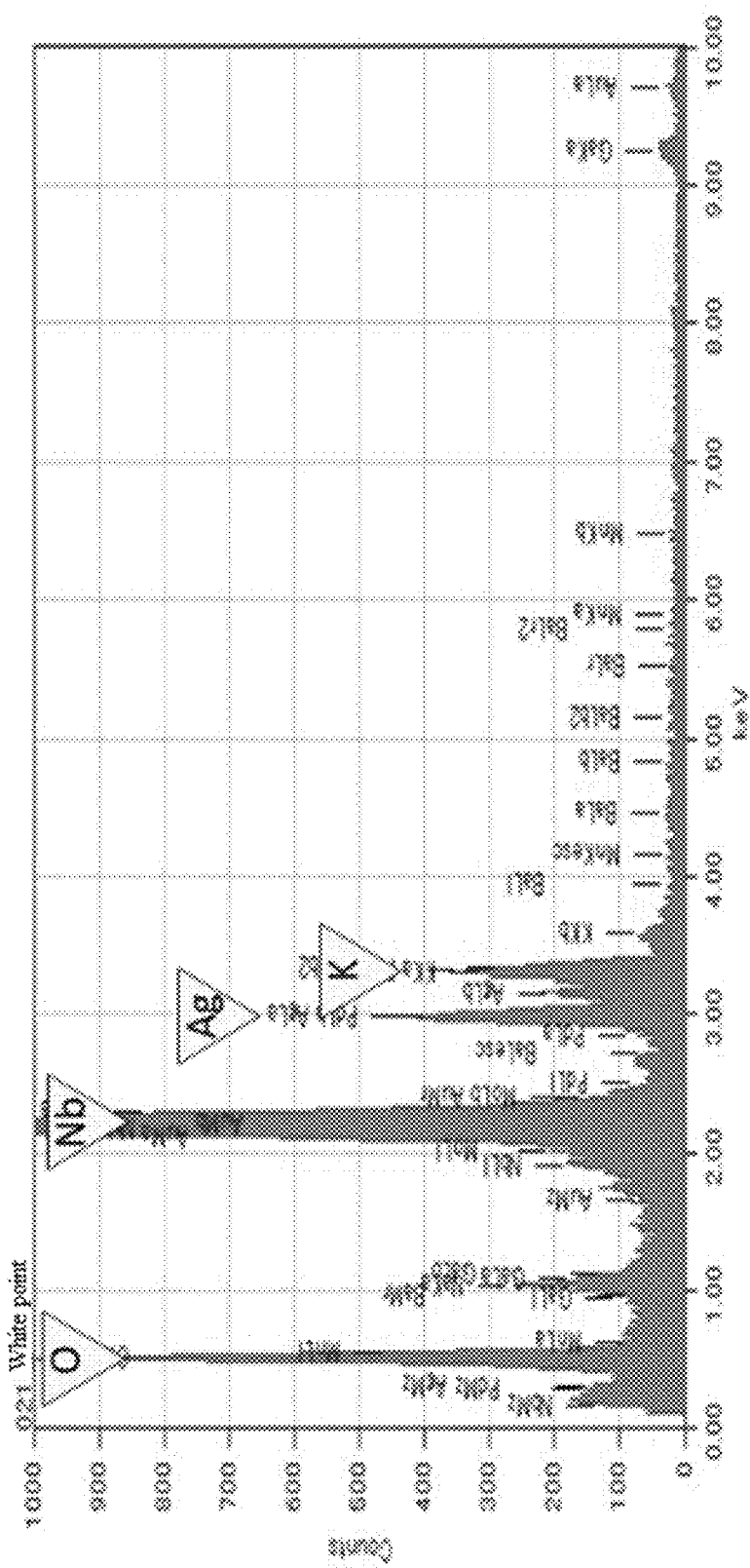
FIG. 4 is an example of spectra observed when a silver-segregated region in a piezoelectric ceramic layer constituting the multilayer piezoelectric element pertaining to an aspect of the present invention is measured with an energy dispersive X-ray spectrometer (EDS).
Figure 5:
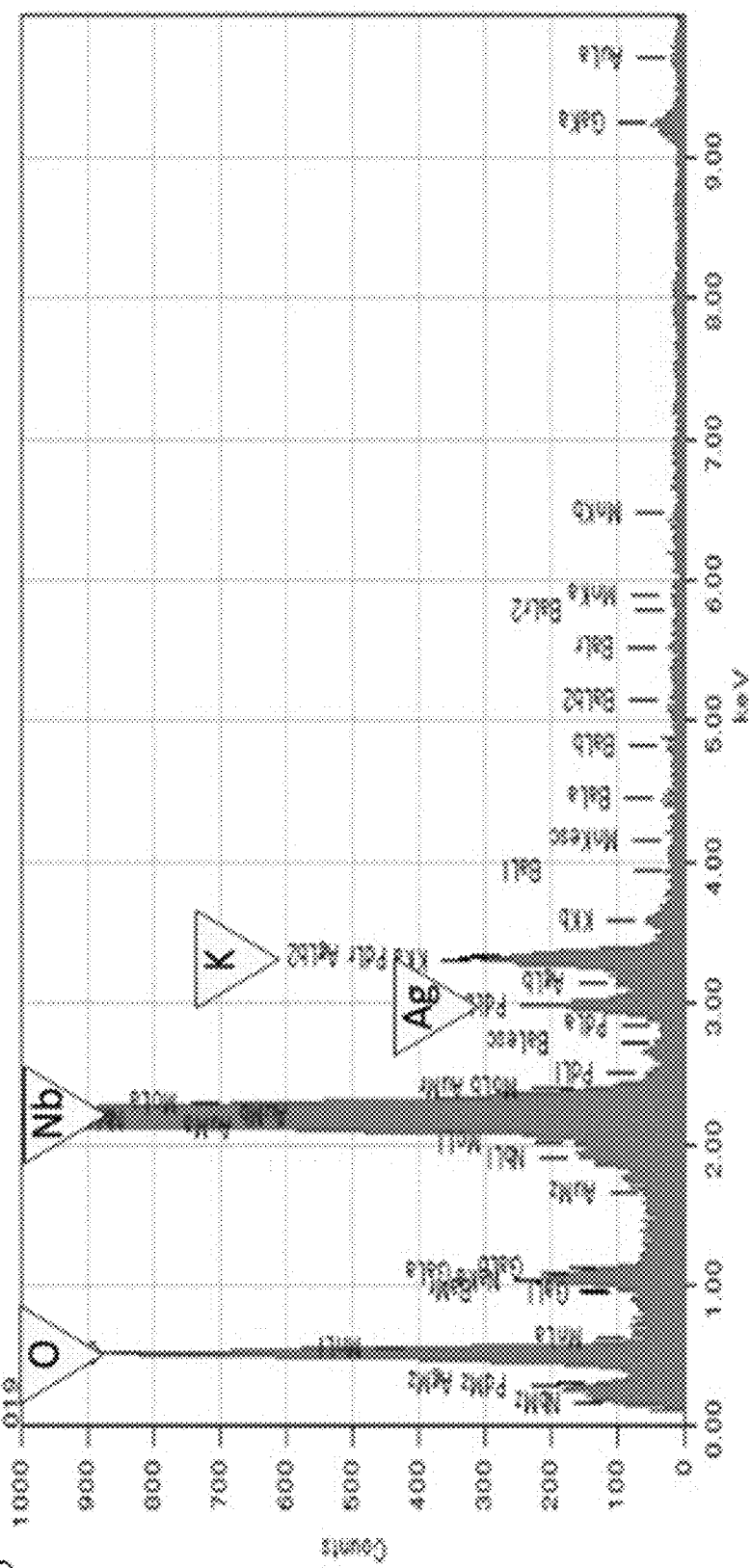
FIG. 5 is an example of spectra observed when the exterior side of a silver-segregated region in a piezoelectric ceramic layer constituting the multilayer piezoelectric element pertaining to an aspect of the present invention is measured with an energy dispersive X-ray spectrometer (EDS).

An example of a sketch based on a TEM image of a piezoelectric ceramic layer 40 observed according to this procedure is shown in FIG. 3. Also, an example of EDS measurement results at a location that has been determined to be a silver-segregated region, and an example of EDS measurement results at a location that has been determined to be the exterior side of the silver-segregated region, are shown in FIG. 4 and FIG. 5, respectively. FIG. 3 shows silver-segregated regions 42 present inside a sintered grain 41. It should be noted that, while silver-segregated regions 42 are depicted in black in FIG. 3, silver-segregated regions 42 appear whiter (brighter) than their surroundings on an actual TEM image, as described above.

Preferably the piezoelectric ceramic layers 40 each contain at least one sintered grain having at least five locations inside that correspond to silver-segregated regions whose long diameter as mentioned above is 10 nm or smaller. This way, superior piezoelectric characteristics are demonstrated. The number of locations corresponding to silver-segregated regions with a long diameter of 10 nm or smaller, in each sintered grain, is preferably eight or greater, or more preferably 10 or greater. It should be noted that these preferred numbers of silver-segregated regions apply only to the first aspect where the content percentage of silver in the metal constituting the internal electrodes 10 is 80 percent by mass or higher. In the case of a multilayer piezoelectric element where this percentage is lower than 80 percent by mass, an increase in the number of silver-segregated regions in the sintered grains may cause the piezoelectric characteristics to drop instead.

The piezoelectric ceramic layers 40 may contain 0.1 percent by mol or more but no more than 3.0 percent by mol of Li, and 0.1 percent by mol or more but no more than 3.0 percent by mol of Si, relative to 100 percent by mol of the primary component mentioned above. When both Li and Si are contained, the piezoelectric ceramic layers 40 can be made denser. Also, the excess Li and Si that could not form a solid solution in the perovskite structure react with each other to generate $Li_2SiO_3$, $Li_4SiO_4$, and other compounds having high electrical insulating property, to inhibit generation of conductive compounds such as $Li_3NbO_4$ and thus contribute to the inhibition of drop in the electrical resistivity of the piezoelectric ceramic layers 40. From the viewpoint of enhancing this action, the ratio by mol of Si to Li (Si/Li) is preferably 1.0 or higher, or more preferably 2.0 or higher.

The content of Li, from the viewpoint of allowing the aforementioned action to be demonstrated fully, is preferably 0.3 percent by mol or higher, or more preferably 0.5 percent by mol or higher, relative to 100 percent by mol of the primary component. On the other hand, keeping the content of Li to no higher than 3.0 percent by mol relative to 100 percent by mol of the primary component inhibits conductive compounds such as $Li_3NbO_4$ from generating and the piezoelectric ceramic will have excellent electrical insulating property and durability. In this respect, the content of Li is preferably no higher than 2.0 percent by mol, or more preferably no higher than 1.5 percent by mol, relative to 100 percent by mol of the primary component.

It should be noted that, while Li is also a constituent element of the primary component mentioned above, the quantity of Li as explained here does not include the Li in the primary component. The quantity of Li not constituting the primary component contained in the piezoelectric ceramic layers 40 is calculated, according to the aforementioned method for determining the alkaline niobate composition formula, as the remainder of the total quantity of Li obtained as a result of composition analysis, less the quantity of Li that can form a solid solution in the alkaline niobate, or it is calculated based on the compositions and contents of the compounds other than the primary component as detected according to the method for confirming the forms of existence of lithium niobate, lithium silicate, and manganese compounds as described below.

The content of Si, from the viewpoint of allowing the aforementioned action to be demonstrated fully, is preferably 0.5 percent by mol or higher, or more preferably 1.0 percent by mol or higher, relative to 100 percent by mol of the primary component. On the other hand, a Si content of no higher than 3.0 percent by mol relative to 100 percent by mol of the primary component keeps the generating quantities of heterogeneous phases having no piezoelectricity low, and the piezoelectric ceramic will have excellent piezoelectric characteristics. In this respect, the content of Si is preferably no higher than 2.5 percent by mol, or more preferably no higher than 2.0 percent by mol, relative to 100 percent by mol of the primary component.

Also, the piezoelectric ceramic layers 40 may contain no more than 2.0 percent by mol of Mn relative to 100 percent by mol of the primary component mentioned above. This improves the electrical resistance of the piezoelectric ceramic layers 40. The lower limit of Mn content, although not limited in any way, is preferably 0.2 percent by mol or higher from the viewpoint of allowing the aforementioned action to be demonstrated fully. By keeping the Mn content to no higher than 2.0 percent by mol, on the other hand, high piezoelectric performance can be retained. The content of Mn is preferably no higher than 1.5 percent by mol, or more preferably no higher than 1.0 percent by mol.

The mechanism of why the electrical resistance improves when the piezoelectric ceramic layers 40 contain Mn, is considered as follows. First, Mn tends to generate oxides of high electrical resistance near the triple points between the sintered grains constituting the alkaline niobate, and also near the internal electrodes 10. It is presumed that the presence of these high-resistance oxides improves the electrical resistance of the piezoelectric ceramic layers 40. Examples of such high-resistance oxides include MnO, $Mn_3O_4$, $MnO_2$, and other manganese oxides, $Li_2MnO_3$, $LiMnO_4$, $LiMn_2O_4$, $KMnO_4$, and other complex compounds of alkali metal and manganese, $MnSiO_3$, $Mn_2SiO_4$, $Mn_7SiO_{12}$, and other complex compounds of silicon and manganese, as well as complex oxides of the foregoing such as $Li_2MnSiO_4$ and $NaMnSi_2O_6$. Additionally, Mn is speculated to act in a manner retaining charge neutrality by forming a solid solution in the B sites, or positioning itself interstitially, in the alkaline niobate having a perovskite structure as mentioned above, thereby inhibiting the valency in the B site from fluctuating. Specifically, as described above, the alkaline earth metal M2 may form a solid solution by replacing the alkali metal positioned in the A sites of the perovskite structure, in which case, due to the valency difference between the two, the valency of Nb, Ta, Sb, etc., positioned in the B site may fluctuate and the electrical resistance, drop. In this scenario, Mn forms a solid solution in the B site as a bivalent cation to generate $Ca(Mn_{1/3}Nb_{2/3})O_3$, $Ba(Mn_{1/3}Nb_{2/3})O_3$, etc., and balance the charge and thereby inhibit the electrical resistance from dropping.

The forms of existence of the aforementioned lithium niobate, lithium silicate, and manganese compounds can be confirmed by measuring the distributions of Li, Mn, and Si in the piezoelectric ceramic layers 40. Examples of equipment for measuring these distributions include: an energy dispersive X-ray spectrometer (EDS) or wavelength dispersive X-ray spectrometer (WDS) installed on a scanning electron microscope (SEM) or transmission electron microscope (TEM); an electron probe micro-analyzer (EPMA); and a laser ablation inductively coupled plasma mass spectrometer (LA-ICP-MS), and the like.

The piezoelectric ceramic layers 40 may contain, as necessary, at least one type of first-row transition element selected from Sc, Ti, V, Cr, Fe, Co, Ni, Cu, and Zn. Containing these elements in appropriate quantities allows for adjustment of the firing temperature, control of grain growth, and extension of lifespan under a high electric field, in/of the multilayer piezoelectric element 100.

Also, the piezoelectric ceramic layers 40 may contain, as necessary, at least one type of second-row transition element selected from Y, Mo, Ru, Rh, and Pd. Containing these elements in appropriate quantities allows for adjustment of the firing temperature, control of grain growth, and extension of lifespan under a high electric field, in/of the multilayer piezoelectric element 100.

Furthermore, the piezoelectric ceramic layers 40 may contain, as necessary, at least one type of third-row transition element selected from La, Ce, Pr, Nd, Sm, Eu, Gd, Tb, Dy, Ho, Er, Tm, Yb, Lu, Hf, W, Re, Os, Ir, Pt, and Au. Containing these elements in appropriate quantities allows for adjustment of the firing temperature, control of grain growth, and extension of the lifespan under a high electric field, in/of the multilayer piezoelectric element 100.

Needless to say, in the first aspect, multiple types of first-row, second-row, and third-row transition elements among those mentioned above may also be contained in the piezoelectric ceramic layers 40. Also, any one or more of the above optional first-row, second-row, and third-row transition elements can expressly be excluded from the piezoelectric ceramic layers 40 except for being contained as impurities. Further, in the above, "appropriate quantities" can readily be determined as workable or optimized ranges by a skilled artisan in view of the present disclosure as a matter of routine experimentation or optimization.

Preferably the sintered grains constituting the piezoelectric ceramic layers 40 satisfy "100 nm≤D50≤800 nm" and "(D90−D10)/D50≤2.0" with respect to their 10-percent diameter (D10), 50-percent diameter (D50), and 90-percent diameter (D90) in the granularity distribution showing cumulative frequencies. Adjusting D50 to 100 nm or larger reduces the total area of sintered grain interfaces, which allows for inhibition of a drop in piezoelectricity that may be otherwise caused by the effect of stress generating at the interfaces. In this respect, D50 is preferably 150 nm or larger, or more preferably 200 nm or larger. On the other hand, keeping D50 to no larger than 800 nm allows for manifestation of high electrical resistance. In this respect, D50 is preferably no larger than 700 nm, or more preferably no larger than 600 nm. Additionally, when "(D90−D10)/D50≤2.0" is satisfied, not only does the electrical resistance of the piezoelectric ceramic layers 40 improve further, but reducing their thickness also becomes easy.

Now, the granularity distribution of sintered grains in the piezoelectric ceramic layers 40 is measured according to the procedure below. First, to add conductivity, platinum is vapor-deposited on a piezoelectric ceramic layer 40 exposed on the surface of the piezoelectric element, to prepare a measurement sample. Next, the measurement sample is observed with a scanning electron microscope (SEM) to capture a microgram of sintered grains. Next, multiple mutually-parallel straight lines are drawn on the captured microgram, and the length of a line segment corresponding to each such straight line after cutting it off at the periphery of each sintered grain (distance between the two points of each straight line that intersect with the periphery of the sintered grain) is taken as the grain size (granularity) of the sintered grains. Using this method, at least 400 sintered grains (randomly selected) are measured for granularity and, from the obtained results, a number-based granularity distribution is obtained. Lastly, D10, D50, and D90 are calculated, respectively, from the obtained granularity distribution.

It should be noted that the method for exposing a piezoelectric ceramic layer 40 on the surface is not limited in any way, and a method whereby the piezoelectric element is cut or ground may be adopted, for example. Also, if the piezoelectric ceramic layer 40 thus exposed does not show the outlines of grains clearly because the surface of the piezoelectric ceramic has been partially removed, heat treatment (thermal etching) should be provided for 5 minutes or so at a temperature lower by around 50° C. than the temperature at which the piezoelectric ceramic layers 40 were fired.

In the first aspect, side margin parts 20 may be formed between both side faces in the Y-axis direction and the internal electrodes 10, and cover parts 30 may be formed on the top and bottom faces in the Z-axis direction, respectively, as shown in FIG. 1. The side margin parts 20 and cover parts 30 function as protective parts that protect the piezoelectric ceramic layers 40 and internal electrodes 10.

From the viewpoint of adjusting the shrinkage factor of the multilayer piezoelectric element 100 during firing, as well as mitigating the internal stress of the multilayer piezoelectric element 100, preferably the side margin parts 20 and cover parts 30 are formed by an alkaline niobate-based sintered body similar to that by which the piezoelectric ceramic layers 40 are formed. However, the material for forming the side margin parts 20 and cover parts 30 is not limited to an alkaline niobate-based piezoelectric ceramic so long as it has high electrical insulating property.

When the side margin parts 20 and cover parts 30 are formed by an alkaline niobate-based sintered body similar to that by which the piezoelectric ceramic layers 40 are formed, preferably the Ag contained in the internal electrodes 10 is evenly diffused in it, just like in the piezoelectric ceramic layers 40. This way, not only can high electrical resistance be ensured in the side margin parts 20 and cover parts 30, but also the internal stress of the multilayer piezoelectric element 100 can be kept low.

In the first aspect, first and second external electrodes (not illustrated) may be provided further on the surface of the multilayer piezoelectric element 100. In this case, the internal electrodes 10 are alternately connected to a different external electrode. According to this constitution, efficient interconversion of the electrical energy between the first and second external electrodes, and the mechanical energy in the stacking direction of the piezoelectric ceramic layers 40 placed between the internal electrodes 10, becomes possible.

The material for constituting the external electrodes is not limited in any way so long as it is highly conductive and physically and chemically stable under the polarization conditions and in the use environment of the piezoelectric element. Examples of electrode materials that can be used include, for example, silver (Ag), copper (Cu), gold (Au), platinum (Pt), palladium (Pd), nickel (Ni), and alloys thereof.

[Method for Manufacturing a Multilayer Piezoelectric Element]

The method for manufacturing a multilayer piezoelectric element pertaining to another aspect of the present invention (hereinafter also referred to simply as the "second aspect") includes: preparing green sheets that contain a powder of an alkaline niobate having a perovskite structure, as well as an organic binder, while also containing at least one type of alkaline earth metal selected from calcium and barium, wherein the total content of the alkaline earth metal is 0.2 percent by mol or higher but lower than 2.0 percent by mol when the element content in the B sites of the alkaline niobate represents 100 percent by mol; placing, on the green sheets, precursors to internal electrodes that contain a metal whose silver content is 80 percent by mass or higher; stacking the green sheets on which the precursors to internal electrodes have been placed, to produce a laminated body; and firing the laminated body to obtain a fired body constituted by internal electrodes provided between sintered body layers whose primary component is the alkaline niobate and which contains at least one type of alkaline earth metal selected from calcium and barium, as well as silver, while also each (piezoelectric ceramic layer) containing at least one sintered grain that has silver-segregated regions inside, wherein the silver-segregated regions have a long diameter of 10 nm or smaller.

The powder of an alkaline niobate having a perovskite structure is obtained, for example, by mixing at a desired ratio and then firing (calcining) a powder of a compound containing at least one type of alkali metal selected from lithium, sodium, and potassium, and a powder of a compound containing niobium. So that the piezoelectric ceramic to be obtained as a final product will have desired properties, a compound containing elements other than alkali metals and niobium may be added. Also, a commercial alkaline niobium powder, if available, may be used directly.

Examples of compounds that may be used include lithium carbonate ($Li_2CO_3$) being a lithium compound, sodium carbonate ($Na_2CO_3$) and sodium hydrogen carbonate ($NaHCO_3$) being sodium compounds, potassium carbonate ($K_2CO_3$) and potassium hydrogen carbonate ($KHCO_3$) being potassium compounds, and niobium pentoxide ($Nb_2O_5$) being a niobium compound. Also, tantalum pentoxide ($Ta_2O_5$) which is a tantalum compound, and antimony trioxide ($Sb_2O_3$) which is an antimony compound, are among the compounds that are frequently-used, but optional, components.

Preferably the compounding ratio of each of the aforementioned compounds is adjusted so that the sintered body of alkaline niobate to be obtained by firing will be expressed by Composition Formula (1) below:

$$(Ag_tM2_u(K_{1-v-w}Na_vLi_w)_{1-t-u})_a(Sb_xTa_yNb_{1-x-y-z}Zr_z)O_3 \qquad (1)$$

It should be noted that, in the formula, M2 represents the aforementioned alkaline earth metal. Also, t, u, v, w, x, y, z, and a represent values satisfying the inequalities expressed by $0.005 < t \leq 0.05$, $0.002 \leq u < 0.02$, $0.007 < t+u < 0.07$, $0 \leq v \leq 1$, $0.02 < w \leq 0.1$, $0.02 < v+w \leq 1$, $0 \leq x \leq 0.1$, $0 \leq y \leq 0.4$, $0 \leq z \leq 0.02$, and $1 < a \leq 1.1$, respectively.

Having prepared at these compounding ratios, the piezoelectric ceramic, when calcined integrally with the internal electrodes formed by a metal whose silver content is 80 percent by mass or higher, can provide a piezoelectric element that offers excellent piezoelectric characteristics as well as a long lifespan even when used under a high electric field.

The method for mixing the aforementioned compound powders is not limited in any way so long as the powders are mixed uniformly in a manner preventing impurities from mixing in, and either dry mixing or wet mixing may be adopted. If wet mixing using a ball mill is adopted as the mixing method, partially stabilized zirconia (PSZ) balls should be used in a ball mill, with ethanol or other organic solvent employed as a dispersion medium, for example, to perform around 8 to 60 hours of agitation, followed by drying to volatilize the organic solvent.

The calcination conditions for the obtained mixed powder are not limited in any way so long as a desired alkaline niobate can be obtained through reaction of the aforementioned compound powders. One example is to perform firing in atmosphere at a temperature of 700 to 1000° C. for 1 to 10 hours. The calcined powder may be used directly in the manufacturing of piezoelectric ceramic, but preferably it is disintegrated using a ball mill, stamp mill, etc., in that doing so will enhance the mixability of the powder with the alkaline earth metal compound and organic binder described below.

In the second aspect, a compound of at least one type of alkaline earth metal selected from calcium and barium is added to the aforementioned powder of an alkaline niobate having a perovskite structure. This alkaline earth metal compound, through an interaction with the silver that diffuses from the internal electrodes during firing as described below, will keep the sizes and size variation of sintered grains in the generated sintered body small and make it dense, thereby contributing to the manifestation of excellent piezoelectric characteristics. Also, as described below, the silver that diffuses from the internal electrodes will contribute to the formation of fine silver-segregated regions in the sintered grains. From the viewpoint of enhancing these actions, preferably the composition of the alkaline niobate and its firing conditions are adjusted so that the alkaline earth metal will exist, at least partially, as a solid solution in the A sites of the alkaline niobate having a perovskite structure.

The alkaline earth metal compound to be used is not limited in any way so long as it is a compound containing calcium or barium. It may contain both of these, or it may contain other elements to the extent that a desired piezoelectric ceramic will be obtained. Examples of alkaline earth metal compounds include calcium carbonate ($CaCO_3$), calcium metasilicate ($CaSiO_3$) and calcium orthosilicate ($Ca_2SiO_4$) that contain calcium, and barium carbonate ($BaCO_3$) that contains barium.

For the alkaline earth metal compound, one containing strontium, etc., other than calcium and barium may be used. However, preferably strontium, etc., are not contained in any substantial way because they undergo the below-mentioned interaction with Ag to a lesser degree and, if contained in large quantities, they are also counterproductive to obtaining a dense ceramic. Here, "not contained in any substantial way" (or "substantially not contained") means they are not contained beyond the quantities that will inevitably mix in during the manufacturing process, such as quantities contained in the materials as impurities and quantities that will mix in when intermediate products are handled (e.g., remaining quantities despite the costly and/or technologically reasonable attempt to exclude such an element in the manufacturing process and associated process, provided that such quantities do not substantially compromise or affect the properties of a final product in any respect). In some embodiments, the piezoelectric ceramic layers consist essentially of calcium and barium as alkaline earth metals or can expressly exclude one or more optional alkaline earth metal(s) or any other optional element(s) listed in this disclosure except for being contained as impurities.

In the second aspect, an organic binder is added to the aforementioned powder of an alkaline niobate having a perovskite structure and alkaline earth metal compound. This organic binder is not limited in type so long as it can form the mixture of the aforementioned components into a desired shape and keep that shape, while volatilizing without leaving carbon, etc., behind through the firing or binder removal treatment preceding thereto. Examples of organic binders that can be used include those based on polyvinyl alcohol, polyvinyl butyral, cellulose, urethane, and vinyl acetate.

The use quantity of the organic binder is not limited in any way, either, but since it will be removed in a subsequent process, preferably its quantity is minimized to the extent that desired formability/shape retentivity can be achieved so that the material cost can be reduced.

The method for mixing the aforementioned components is not limited in any way so long as the components are mixed uniformly in a manner preventing impurities from mixing in. One example is ball mill mixing.

When mixing the aforementioned components, various additives may be mixed in such as a plasticizer to improve the formability of the mixture into green sheets afterward and a dispersant to disperse the powder uniformly.

Also, in addition to Li, Si, and Mn explained in the first aspect, additive elements that are used for improving the various properties of piezoelectric ceramics, as well as compounds or compositions that function as sintering auxiliaries, may be mixed in. When additive elements are to be mixed in, examples of compounds that may be used include lithium carbonate ($Li_2CO_3$) being a compound that contains Li, silicon dioxide ($SiO_2$) being a compound that contains Si, manganese carbonate ($MnCO_3$), manganese monoxide (MnO), manganese dioxide ($MnO_2$), manganomanganic oxide ($Mn_3O_4$), and manganese acetate ($Mn(OCOCH_3)_2$) being compounds that contain Mn, lithium metasilicate ($Li_2SiO_3$) and lithium orthosilicate ($Li_4SiO_4$) being compounds that contain Li and Si, and calcium metasilicate ($CaSiO_3$) and calcium orthosilicate ($Ca_2SiO_4$) being compounds that contain Ca and Si.

Among these additive elements, Si is useful because it can inhibit the alkali metals from volatilizing or precipitating between the sintered grains by reacting, when fired, with the elements contained in the alkaline niobate or elements that have been added separately, and thus causing $Li_2SiO_3$, $Li_4SiO_4$, $K_3Nb_3O_6Si_2O_7$, $KNbSi_2O_7$, $K_3LiSiO_4$, $KLi_3SiO_4$, and other crystalline phases, or non-crystalline phases containing the foregoing elements, to precipitate.

Additionally, Si, when combined with Li, manifests its function as a sintering auxiliary and also presents the action of significantly lowering the firing temperature. In this case, preferably the additive quantities of Si and Li are adjusted to the ranges explained in the first aspect.

As described, the second aspect allows various additive elements to be mixed in. As for Ag, however, preferably it is not mixed in under the second aspect that actively utilizes diffusion of Ag because, if Ag is contained in the green sheets, diffusion of Ag from the internal electrodes to the sintered body layers is inhibited during firing.

Regarding the method for forming green sheets from a mixture of the aforementioned components, the doctor blade method, extrusion molding method, or any other commonly used method may be adopted.

In the second aspect, precursors to internal electrodes containing a metal whose silver content is 80 percent by mass or higher are placed on the green sheets obtained per the aforementioned procedure. The precursors to internal electrodes can be placed using any commonly used method, but a method of printing or applying, into the shapes of internal electrodes, a paste that contains a metal powder whose silver content is 80 percent by mass or higher, is preferred in terms of cost. When placing the precursors to internal electrodes by means of printing or application, glass frits, or a powder having a composition similar to that of the alkaline niobate powder contained in the green sheets, may be contained in the paste to improve its strength of adhesion to the sintered body layers after firing.

When placing the precursors to internal electrodes on the green sheets, they may be placed at intervals where side margin parts will be formed in the resulting multilayer piezoelectric element.

In the second aspect, the aforementioned green sheets on which the precursors to internal electrodes have been placed are stacked, after which the green sheets are bonded together to produce a laminated body.

The stacking and bonding can be performed using any commonly used method, but a method of thermocompression-bonding the green sheets together using the action of a binder is preferred in terms of cost.

At the time of stacking and compression-bonding, green sheets that will become cover parts in the resulting multilayer piezoelectric element may be added at both end parts in the stacking direction. In this case, the green sheets to be added may have a composition identical to, or different from, the composition of the aforementioned green sheets on which the precursors to internal electrodes have been placed. From the viewpoint of aligning the shrinkage factors during firing, preferably the composition of the green sheets to be added is identical or similar to the composition of the aforementioned green sheets on which the precursors to internal electrodes have been placed.

In the second aspect, the laminated body obtained per the aforementioned procedure is fired. Prior to the firing, the organic binder may be removed from the laminated body. In this case, the removal of the organic binder, and the firing, may be performed in succession using the same firing apparatus. The conditions for removing the organic binder, and for firing, should be set as deemed appropriate by considering the volatilization temperature and amount of the binder, sintering property of the piezoelectric ceramic composition, durability of the internal electrode material, and so on. Examples of conditions for removing the organic binder include 1 to 5 hours in atmosphere at a temperature of 300 to 500° C. Examples of firing conditions to be maintained include 1 to 5 hours in atmosphere at a temperature of 800 to 1100° C. If multiple sintered body for multilayer piezoelectric elements are to be obtained from a single green body, the green body may be split into several blocks prior to the firing.

In the second aspect, through the aforementioned firing, internal electrodes are formed from the precursors to internal electrodes at the same time as alkaline-niobate sintered body layers are formed from the aforementioned green sheets, to obtain a fired body having the internal electrodes between the sintered body layers whose primary component is an alkaline niobate. It is considered that, as this happens, Ag diffuses from the internal electrodes to the sintered body layers and interacts with at least one type of alkaline earth metal selected from calcium and barium. Presumably this interaction causes the sintered body layers to become dense, comprising fine sintered grains. It is also presumed that, of the Ag that has diffused to the sintered body layers, a portion that could not form a solid solution in the A sites of the perovskite structure forms silver-segregated regions of 10 nm or smaller in long diameter in the sintered grains, thereby inhibiting the electrical insulating property of the sintered body layers from dropping. This means that, when the content of Ag in the internal electrodes is low and the quantity of Ag diffusing to the sintered body layers is small, Ag will form a solid solution in the A sites of the alkaline niobate having a perovskite structure and therefore diminishment of the electrical insulating property of the sintered body layers does not pose a problem. If the Ag content in the metal constituting the internal electrodes increases to 80 percent by mass or higher, however, the quantity of Ag that diffuses to the sintered body layers will also increase and some will no longer form a solid solution in the aforementioned A sites. Traditionally, such Ag precipitates between the sintered grains and forms conduction pathways, thereby causing the electrical insulating property of the sintered body layers to drop. In the second aspect, however, an interaction between specific alkaline earth metals and Ag leads to a formation of fine silver-segregated regions inside the sintered grains to inhibit the electrical insulating property from dropping.

In the second aspect, the sintered body obtained by firing is polarization-treated to become a multilayer piezoelectric element. The polarization treatment is typically performed by forming a pair of electrodes on the surface of the sintered body using a conductive material, and then impressing high voltage between the electrodes.

For the forming of electrodes, a method of applying or printing and then baking a paste containing an electrode material onto the surface of the sintered body, a method of vapor-depositing an electrode material on the surface of the sintered body, or any other commonly used method, may be adopted. For the electrode material, silver (Ag), copper (Cu), gold (Au), platinum (Pt), palladium (Pd), nickel (Ni), and alloys thereof, which were cited as materials for constituting the external electrodes in the first aspect, may be used.

The conditions for polarization treatment are not limited in any way so long as the orientation of spontaneous polarization can be aligned in each sintered body layer without causing the sintered body to suffer cracks and other damage. One example is to impress an electric field of 4 to 6 kV/mm at a temperature of 100 to 150° C.

EXAMPLES

The present invention is explained more specifically below using examples; however, it should be noted that the present invention is not limited to these examples.

Example 1

[Manufacturing of Multilayer Piezoelectric Elements]

As a powder of an alkaline niobate having a perovskite structure, a calcined powder expressed by the composition formula $Li_{0.064}Na_{0.52}K_{0.42}NbO_3$ was prepared. To this calcined powder representing 100 percent by mol, 0.5 percent by mol of $BaCO_3$, 0.65 percent by mol of $Li_2CO_3$, 1.3 percent by mol of $SiO_2$, 0.5 percent by mol of MnO, and a polyvinyl butyral-based organic binder, were added, respectively, and all were mixed in a wet ball mill. The obtained mixed slurry was formed, using a doctor blade, into green sheets of 80 μm in thickness. On these green sheets, an Ag—Pd alloy paste (Ag/Pd ratio by mass=8/2) was screen-printed to form electrode patterns, after which the green sheets were stacked and then compression-bonded under heating with a pressure of approx. 50 MPa, to obtain a laminated body. This laminated body was cut to individual pieces, which were then treated in atmosphere to remove the binder, followed by firing at 1000° C. for 2 hours in atmosphere, to obtain sintered bodies. On the surface of each of these sintered bodies, a conductive paste containing Ag was applied in a manner contacting the alternately exposed layers of internal electrodes on the surface, and then fired by raising the temperature to 600° C., to form a pair of external electrodes. Finally, an electric field of 3.0 kV/mm was impressed for 3 minutes between the pair of external electrodes in a thermostatic chamber controlled at 100° C., to obtain each of the multilayer piezoelectric elements pertaining to Example 1.

[Confirmation of Silver-Segregated Regions in Piezoelectric Ceramic Layer]

When a piezoelectric ceramic layer in one of the obtained multilayer piezoelectric elements was checked for presence/absence of silver-segregated regions in sintered grains and their long-diameter lengths were measured according to the aforementioned methods, silver-segregated regions were confirmed in sintered grains and their long-diameter lengths were all 5 nm or smaller. Also, sintered grains having at least five locations inside that correspond to silver-segregated regions with a long-diameter length of 5 nm or smaller, were also confirmed.

[Granularity Distribution Measurement of Sintered Grains in Piezoelectric Ceramic Layer]

When a piezoelectric ceramic layer in one of the obtained multilayer piezoelectric elements was measured for granularity distribution of sintered grains according to the aforementioned method, D50 was 550 nm and (D90–D10)/D50 was 1.15.

[Electrical Reliability Test]

The obtained multilayer piezoelectric elements were evaluated for electrical reliability based on average lifespan. Each multilayer piezoelectric element was placed in a thermostatic chamber controlled at 100° C. and then a direct-current electric field of 8 kV/mm was impressed between the external electrodes, to measure the time until the value of current flowing between the external electrodes reached 1 mA or larger. Then, the average value of this time, calculated from ten piezoelectric elements, was adopted as the average service life. The average lifespan obtained from the measured results was 1800 minutes.

[Evaluation of Piezoelectric Characteristics]

One of the obtained multilayer piezoelectric elements was evaluated for piezoelectric characteristics using a piezoelectric constant $d^*_{33}$ based on displacement. The displacement of the multilayer piezoelectric element was measured using a laser doppler displacement gauge by applying, to the element, unipolar sinusoidal waves that have the maximum electric field of 8 kV/mm at approx. 100 Hz. The value of $d^*_{33}$ calculated from the measured results was 220 pm/V.

Comparative Example 1

[Manufacturing of Multilayer Piezoelectric Elements]

The multilayer piezoelectric elements pertaining to Comparative Example 1 were manufactured in the same manner as in Example 1, except that the Ag—Pd alloy paste used in the forming of electrode patterns on the green sheets was changed to one with an Ag/Pd ratio by mass of 7/3 and that the firing temperature of the laminated body was changed to 950° C.

[Confirmation of Silver-Segregated Regions in Piezoelectric Ceramic Layer]

When a piezoelectric ceramic layer in one of the obtained multilayer piezoelectric elements was checked for presence/absence of silver-segregated regions in sintered grains and their long-diameter lengths were measured according to the same methods in Example 1, silver-segregated regions were confirmed in sintered grains and their long-diameter lengths were all 10 nm or smaller. However, the observed silver-segregated regions included relatively large ones whose long-diameter length exceeded 5 nm. Also, the maximum number of locations confirmed in a sintered grain, each corresponding to a silver-segregated region with a long-diameter length of 10 nm or smaller, was three.

[Granularity Distribution Measurement of Sintered Grains in Piezoelectric Ceramic Layer]

When a piezoelectric ceramic layer in one of the obtained multilayer piezoelectric elements was measured for granularity distribution of sintered grains according to the same method in Example 1, D50 was 450 nm and (D90–D10)/D50 was 0.95.

[Electrical Reliability Test]

When the obtained multilayer piezoelectric elements were evaluated for electrical reliability according to the same method in Example 1, the average lifespan was 3200 minutes.

[Evaluation of Piezoelectric Characteristics]

When one of the obtained multilayer piezoelectric elements was evaluated for piezoelectric characteristics according to the same method in Example 1, $d^*_{33}$ was 210 pm/V.

Example 2

[Manufacturing of Multilayer Piezoelectric Elements]

The multilayer piezoelectric elements pertaining to Example 2 were manufactured in the same manner as in Example 1, except that the Ag—Pd alloy paste used in the forming of electrode patterns on the green sheets was changed to one with an Ag/Pd ratio by mass of 9/1 and that the firing temperature of the laminated body was changed to 1030° C.

[Confirmation of Silver-Segregated Regions in Piezoelectric Ceramic Layer]

When a piezoelectric ceramic layer in one of the obtained multilayer piezoelectric elements was checked for presence/absence of silver-segregated regions in sintered grains and their long-diameter lengths were measured according to the same methods in Example 1, silver-segregated regions were confirmed in sintered grains and their long-diameter lengths were all 10 nm or smaller, where the smallest was 1.6 nm and the largest was 4 nm, and the average diameter was 2.2 nm.

[Granularity Distribution Measurement of Sintered Grains in Piezoelectric Ceramic Layer]

When a piezoelectric ceramic layer in one of the obtained multilayer piezoelectric elements was measured for granularity distribution of sintered grains according to the same method in Example 1, D50 was 680 nm and (D90–D10)/D50 was 1.20.

[Electrical Reliability Test]

When the obtained multilayer piezoelectric elements were evaluated for electrical reliability according to the same method in Example 1, the average lifespan was 1200 minutes.

[Evaluation of Piezoelectric Characteristics]

When one of the obtained multilayer piezoelectric elements was evaluated for piezoelectric characteristics according to the same method in Example 1, $d^*_{33}$ was 225 pm/V.

Example 3

[Manufacturing of Multilayer Piezoelectric Elements]

The multilayer piezoelectric elements pertaining to Example 3 were manufactured in the same manner as in Example 2, except that $CaCO_3$ was added to the calcined powder of alkaline niobate instead of $BaCO_3$.

[Confirmation of Silver-Segregated Regions in Piezoelectric Ceramic Layer]

When a piezoelectric ceramic layer in one of the obtained multilayer piezoelectric elements was checked for presence/absence of silver-segregated regions in sintered grains and their long-diameter lengths were measured according to the same methods in Example 1, silver-segregated regions were confirmed in sintered grains and their long-diameter lengths were all 10 nm or smaller. When the long diameters of these regions were checked, the smallest was 1.5 nm and the largest was 4.5 nm, and the average diameter was 2.6 nm.

[Granularity Distribution Measurement of Sintered Grains in Piezoelectric Ceramic Layer]

When a piezoelectric ceramic layer in one of the obtained multilayer piezoelectric elements was measured for granularity distribution of sintered grains according to the same method in Example 1, D50 was 440 nm and (D90–D10)/D50 was 0.98.

[Electrical Reliability Test]

When the obtained multilayer piezoelectric elements were evaluated for electrical reliability according to the same method in Example 1, the average lifespan was 1060 minutes.

[Evaluation of Piezoelectric Characteristics]

When one of the obtained multilayer piezoelectric elements was evaluated for piezoelectric characteristics according to the same method in Example 1, $d^*_{33}$ was 210 pm/V.

Comparative Example 2

[Manufacturing of Multilayer Piezoelectric Elements]

The multilayer piezoelectric elements pertaining to Comparative Example 2 were manufactured in the same manner as in Example 1, except that $SrCO_3$ was added to the calcined powder of alkaline niobate instead of $BaCO_3$, that the Ag—Pd alloy paste used in the forming of electrode patterns on the green sheets was changed to one with an Ag/Pd ratio by mass of 7/3, and that the firing temperature of the laminated body was changed to 1100° C.

[Confirmation of Silver-Segregated Regions in Piezoelectric Ceramic Layer]

When a piezoelectric ceramic layer in one of the obtained multilayer piezoelectric elements was checked for presence/absence of silver-segregated regions in sintered grains and their long-diameter lengths were measured according to the same methods in Example 1, silver-segregated regions were confirmed in sintered grains and their long-diameter lengths were all 10 nm or smaller. When the long diameters of these regions were checked, the smallest was 2.9 nm and the largest was 7.2 nm, and the average diameter was 5.2 nm.

[Granularity Distribution Measurement of Sintered Grains in Piezoelectric Ceramic Layer]

When a piezoelectric ceramic layer in one of the obtained multilayer piezoelectric elements was measured for granularity distribution of sintered grains according to the same method in Example 1, D50 was 480 nm and (D90–D10)/D50 was 1.02.

[Electrical Reliability Test]

When the obtained multilayer piezoelectric elements were evaluated for electrical reliability according to the same method in Example 1, the average lifespan was 1500 minutes.

[Evaluation of Piezoelectric Characteristics]

When one of the obtained multilayer piezoelectric elements was evaluated for piezoelectric characteristics according to the same method in Example 1, $d^*_{33}$ was 210 pm/V.

Comparative Example 3

[Manufacturing of Multilayer Piezoelectric Elements]

Manufacturing of multilayer piezoelectric elements pertaining to Comparative Example 3 was attempted in the same manner as in Comparative Example 2, except that the Ag—Pd alloy paste used in the forming of electrode patterns on the green sheets was changed to one with an Ag/Pd ratio by mass of 9/1 and that the firing temperature of the laminated body was changed to 1030° C. However, dense sintered body layers could not be achieved in the obtained sintered bodies.

Comparative Example 4

[Manufacturing of Multilayer Piezoelectric Elements]

Manufacturing of multilayer piezoelectric elements pertaining to Comparative Example 4 was attempted in the same manner as in Comparative Example 3, except that the firing temperature of the laminated body was changed to 1100° C. However, the internal electrodes had melted and thus the laminated structure could not be formed in the obtained sintered bodies.

With regard to Examples 1 to 3 and Comparative Examples 1 to 4 explained above, the compositions of internal electrodes and sintered body layers are shown in Table 1, while the firing temperatures and confirmed results of characteristics are shown in Table 2, respectively.

TABLE 1

| | Internal electrodes | Composition of calcined powder | Additives (percentage to 100% by mol of calcined powder) |
|---|---|---|---|
| Example 1 | $Ag_{0.8}Pd_{0.2}$ | $Li_{0.064}Na_{0.52}K_{0.42}NbO_3$ | 0.5 mol % $BaCO_3$, 0.65 mol % $Li_2CO_3$, 1.3 mol % $SiO_2$, 0.5 mol % MnO |
| Comparative Example 1 | $Ag_{0.7}Pd_{0.3}$ | | |
| Example 2 | $Ag_{0.9}Pd_{0.1}$ | | |
| Example 3 | $Ag_{0.9}Pd_{0.1}$ | | 0.5 mol % $CaCO_3$, 0.65 mol % $Li_2CO_3$, 1.3 mol % $SiO_2$, 0.5 mol % MnO |
| Comparative Example 2 | $Ag_{0.7}Pd_{0.3}$ | | 0.5 mol % $SrCO_3$, 0.65 mol % $Li_2CO_3$, 1.3 mol % $SiO_2$, 0.5 mol % MnO |
| Comparative Example 3 | $Ag_{0.9}Pd_{0.1}$ | | |
| Comparative Example 4 | $Ag_{0.9}Pd_{0.1}$ | | |

TABLE 2

| | Firing temperature (° C.) | D50 (nm) | (D90-D10)/D50 | Silver-segregated regions of 10 nm or smaller in long diameter in sintered grains | Average lifespan (minutes) | $d^*_{33}$ (pm/V) |
|---|---|---|---|---|---|---|
| Example 1 | 1000 | 550 | 1.15 | Yes | 1800 | 220 |
| Comparative Example 1 | 950 | 450 | 0.95 | | 3200 | 210 |
| Example 2 | 1030 | 680 | 1.20 | | 1200 | 225 |
| Example 3 | 1030 | 440 | 0.98 | | 1060 | 210 |
| Comparative Example 2 | 1100 | 480 | 1.02 | | 1500 | 210 |
| Comparative Example 3 | 1030 | Not checked because dense sintered body layers could not be achieved. | | | | |
| Comparative Example 4 | 1150 | Not checked because the internal electrodes had melted. | | | | |

When Examples 1 and 2 are compared against Comparative Example 1, it is revealed that the multilayer piezoelectric elements according to the Examples, whose piezoelectric ceramic layers are constituted by an alkaline niobate as a primary component and further contain calcium or barium and silver, and whose internal electrodes are formed by a metal that contains silver by 80 percent by mass or higher, retain enough electrical insulating property to withstand practical use and also demonstrate excellent piezoelectric characteristics. Here, the superior electrical insulating property (average lifespan of the element) in Comparative Example 1 is understood to be the result of a smaller quantity of silver diffusing to the piezoelectric ceramic layers during firing due in part to the internal electrodes formed by a metal with a low content percentage of silver and in part to a low firing temperature. In other words, when the internal electrodes are formed by a metal with a low content percentage of silver, the difference in silver concentration between the internal electrodes and the piezoelectric ceramic layers becomes small, which decreases the force of driving the diffusion of silver to the piezoelectric ceramic layers and reduces the diffusion quantity of silver, and in addition to this, the foregoing effect also inhibits the sintering property of the piezoelectric ceramic layers from dropping due to diffusion of silver, which enables a lower firing temperature and a further reduction in the quantity of silver diffusing to the piezoelectric ceramic layers. Based on the above, the multilayer piezoelectric elements pertaining to Examples 1 and 2 are found to provide improved piezoelectric characteristics while inhibiting their electrical insulating property from dropping, despite an increased quantity of silver diffusing to the piezoelectric ceramic layers.

Also, when Examples 1 to 3 are compared against Comparative Examples 2 to 4, it can be argued that, in the Examples where calcium or barium is added to an alkaline niobate as an alkaline earth metal, dense sintered body layers having fine silver-segregated regions inside sintered grains are generated, even when they are integrally sintered with internal electrodes formed by a metal that contains silver by 80 percent by mass or higher, and consequently a multilayer piezoelectric element offering excellent electrical reliability and piezoelectricity can be obtained. On the other hand, it can be argued that, in the Comparative Examples where strontium is added to an alkaline niobate as an alkaline earth metal, dense sintered body layers having fine silver-segregated regions inside sintered grains are generated, just like in the Examples, when they are integrally sintered with internal electrodes formed by a metal that contains silver by 70 percent by mass and consequently a multilayer piezoelectric element offering excellent electrical reliability and piezoelectricity can be obtained; however, when they are integrally sintered with internal electrodes having a higher content of silver, it is difficult to obtain dense sintered body layers at a firing temperature below the melting point of the internal electrodes.

Examples 4 and 5

[Manufacturing of Multilayer Piezoelectric Elements]

The multilayer piezoelectric elements pertaining to Example 4 were manufactured in the same manner as in Example 2, except that the quantity of $BaCO_3$ to be added to the calcined powder of alkaline niobate was changed to 0.2 percent by mol relative to 100 percent by mol of the calcined powder and that the sintering temperature of the laminated body was changed to 930° C. Also, the multilayer piezoelectric elements pertaining to Example 5 were manufactured in the same manner as in Example 2, except that the quantity of $BaCO_3$ was changed to 1.0 percent by mol relative to 100 percent by mol of the calcined powder.

[Confirmation of Silver-Segregated Regions in Piezoelectric Ceramic Layer]

When a piezoelectric ceramic layer in one of the multilayer piezoelectric elements obtained in each Example was checked for presence/absence of silver-segregated regions in sintered grains and their long-diameter lengths were measured according to the same methods in Example 1, silver-segregated regions were confirmed in sintered grains in both elements, and their long-diameter lengths were all 10 nm or smaller.

[Granularity Distribution Measurement of Sintered Grains in Piezoelectric Ceramic Layer]

When a piezoelectric ceramic layer in one of the multilayer piezoelectric elements obtained in each Example was measured for granularity distribution of sintered grains according to the same method in Example 1, D50 was 2300 nm and (D90−D10)/D50 was 2.40 in Example 4, while D50 was 480 nm and (D90−D10)/D50 was 0.90 in Example 5.

[Electrical Reliability Test]

When the multilayer piezoelectric elements obtained in each Example were evaluated for electrical reliability according to the same method in Example 1, the average lifespan was 500 minutes in Example 4 and 50 minutes in Example 5.

[Evaluation of Piezoelectric Characteristics]

When one of the multilayer piezoelectric elements obtained in each Example was evaluated for piezoelectric characteristics according to the same method in Example 1, $d^*_{33}$ was 195 pm/V in Example 4 and 210 pm/V in Example 5.

Comparative Examples 5 and 6

[Manufacturing of Multilayer Piezoelectric Elements]

Manufacturing of multilayer piezoelectric elements pertaining to Comparative Example 5 was attempted in the same manner as in Example 2, except that the quantity of $BaCO_3$ to be added to the calcined powder of alkaline niobate was changed to 2.0 percent by mol relative to 100 percent by mol of the calcined powder. However, dense sintered body layers could not be achieved in the obtained sintered bodies. Accordingly, manufacturing of multilayer piezoelectric elements pertaining to Comparative Example 6 was attempted by raising the firing temperature to 1100° C. However, the internal electrodes melted and thus the laminated structure could not be retained in the obtained sintered bodies.

Examples 6 and 7

[Manufacturing of Multilayer Piezoelectric Elements]

The multilayer piezoelectric elements pertaining to Example 6 were manufactured in the same manner as in Example 3, except that the quantity of $CaCO_3$ to be added to the calcined powder of alkaline niobate was changed to 0.2 percent by mol relative to 100 percent by mol of the calcined powder and that the sintering temperature of the laminated body was changed to 930° C. Also, the multilayer piezoelectric elements pertaining to Example 7 were manufactured in the same manner as in Example 3, except that the quantity of $CaCO_3$ was changed to 1.0 percent by mol relative to 100 percent by mol of the calcined powder.

[Confirmation of Silver-Segregated Regions in Piezoelectric Ceramic Layer]

When a piezoelectric ceramic layer in one of the multilayer piezoelectric elements obtained in each Example was checked for presence/absence of silver-segregated regions in sintered grains and their long-diameter lengths were measured according to the same methods in Example 1, silver-segregated regions were confirmed in sintered grains in both elements, and their long-diameter lengths were all 10 nm or smaller.

[Granularity Distribution Measurement of Sintered Grains in Piezoelectric Ceramic Layer]

When a piezoelectric ceramic layer in one of the multilayer piezoelectric elements obtained in each Example was measured for granularity distribution of sintered grains according to the same method in Example 1, D50 was 1200 nm and (D90–D10)/D50 was 2.60 in Example 6, while D50 was 430 nm and (D90–D10)/D50 was 0.81 in Example 7.

[Electrical Reliability Test]

When the multilayer piezoelectric elements obtained in each Example were evaluated for electrical reliability according to the same method in Example 1, the average lifespan was 400 minutes in Example 6 and 10 minutes in Example 7.

[Evaluation of Piezoelectric Characteristics]

When one of the multilayer piezoelectric elements obtained in each Example was evaluated for piezoelectric properties according to the same method in Example 1, $d^*_{33}$ was 170 pm/V in Example 6 and 220 pm/V in Example 7.

Comparative Examples 7 and 8

[Manufacturing of Multilayer Piezoelectric Elements]

Manufacturing of multilayer piezoelectric elements pertaining to Comparative Example 7 was attempted in the same manner as in Example 3, except that the quantity of $CaCO_3$ to be added to the calcined powder of alkaline niobate was changed to 2.0 percent by mol relative to 100 percent by mol of the calcined powder. However, dense sintered body layers could not be achieved in the obtained sintered bodies. Accordingly, manufacturing of multilayer piezoelectric elements pertaining to Comparative Example 8 was attempted by raising the firing temperature to 1100° C. However, the internal electrodes melted and thus the laminated structure could not be retained in the obtained sintered bodies.

With regard to Examples 4 to 7 and Comparative Examples 5 to 8 explained above, the compositions of internal electrodes and sintered body layers are shown in Table 3, while the firing temperatures and confirmed results of properties are shown in Table 4, respectively. In Table 4, the aforementioned results of Examples 2 and 3 are also shown for ease of understanding of the trends of how the properties change according to the additive quantity of alkaline earth metal.

TABLE 4

| | Firing temperature (° C.) | D50 (nm) | (D90-D10)/D50 | Silver-segregated regions of 10 nm or smaller in long diameter in sintered grains | Average lifespan (minutes) | $D^*_{33}$ (pm/V) |
|---|---|---|---|---|---|---|
| Example 4 | 930 | 2300 | 2.40 | Yes | 500 | 195 |
| Example 2 | 1030 | 680 | 1.20 | | 1200 | 225 |
| Example 5 | 1030 | 480 | 0.90 | | 50 | 210 |
| Comparative Example 5 | 1030 | Not checked because dense sintered body layers could not be achieved. | | | | |
| Comparative Example 6 | 1100 | Not checked because the internal electrodes had melted. | | | | |
| Example 6 | 930 | 1200 | 2.60 | Yes | 400 | 170 |
| Example 3 | 1030 | 440 | 0.98 | | 1060 | 210 |
| Example 7 | 1030 | 430 | 0.81 | | 10 | 220 |
| Comparative Example 7 | 1030 | Not checked because dense sintered body layers could not be achieved. | | | | |
| Comparative Example 8 | 1100 | Not checked because the internal electrodes had melted. | | | | |

When Examples 2, 4, and 5 are compared against Comparative Examples 5 and 6, and also when Examples 3, 6, and 7 are compared against Comparative Examples 7 and 8, it can be argued that, when a multilayer piezoelectric element is manufactured by adding an alkaline earth metal by less than 2.0 percent by mol relative to 100 percent by mol of the elements in the B sites of the alkaline niobate, dense sintered body layers can be obtained without causing the internal electrodes to melt, even when internal electrodes containing a metal with an Ag/Pd ratio by mass of 9/1 are used, whereas, when the additive quantity of the alkaline earth metal is 2 percent by mol or higher, it becomes difficult to obtain a multilayer piezoelectric element having dense sintered body layers without causing the internal electrodes to melt. Additionally, when Examples 2, 4, and 5 are compared, and also when Examples 3, 6, and 7 are compared, it can be presumed that, when the additive quantity of the alkaline earth metal is in a range of 0.2 to 0.5 percent by mol, the multilayer piezoelectric element will have significantly improved electrical reliability and improved piezoelectric characteristics due to an increase in the additive quantity, and also that, when the additive quantity of the alkaline earth metal is in a range of 0.5 to 1.0 percent by mol, excellent piezoelectric characteristics can be achieved. It should be noted that the multilayer piezoelectric elements pertaining to Examples 5 and 7, although having a shorter lifespan, demonstrate excellent piezoelectric characteristics

TABLE 3

| | Internal electrodes | Composition of calcined powder | Additives (percentage to 100% by mol of calcined powder) |
|---|---|---|---|
| Example 4 | $Ag_{0.9}Pd_{0.1}$ | $Li_{0.064}Na_{0.52}K_{0.42}NbO_3$ | 0.2 mol % $BaCO_3$, 0.65 mol % $Li_2CO_3$, 1.3 mol % $SiO_2$, 0.5 mol % MnO |
| Example 5 | | | 1.0 mol % $BaCO_3$, 0.65 mol % $Li_2CO_3$, 1.3 mol % $SiO_2$, 0.5 mol % MnO |
| Comparative Example 5 | | | 2.0 mol % $BaCO_3$, 0.65 mol % $Li_2CO_3$, 1.3 mol % $SiO_2$, 0.5 mol % MnO |
| Comparative Example 6 | | | |
| Example 6 | | | 0.2 mol % $CaCO_3$, 0.65 mol % $Li_2CO_3$, 1.3 mol % $SiO_2$, 0.5 mol % MnO |
| Example 7 | | | 1.0 mol % $CaCO_3$, 0.65 mol % $Li_2CO_3$, 1.3 mol % $SiO_2$, 0.5 mol % MnO |
| Comparative Example 8 | | | 2.0 mol % $CaCO_3$, 0.65 mol % $Li_2CO_3$, 1.3 mol % $SiO_2$, 0.5 mol % MnO | and thus are sufficiently practicable in applications associated with fewer operating hours.

Examples 8 to 11

[Manufacturing of Multilayer Piezoelectric Elements]

The multilayer piezoelectric elements pertaining to Example 8 were manufactured in the same manner as in Example 5, except that the quantity of $ZrO_2$ to be added to the calcined powder of alkaline niobate was changed to 0.2 percent by mol relative to 100 percent by mol of the calcined powder and that the firing temperature of the laminated body was changed to 1010° C. Also, the multilayer piezoelectric elements pertaining to Example 9 were manufactured in the same manner as in Example 5, except that the quantity of $ZrO_2$ was changed to 0.5 percent by mol relative to 100 percent by mol of the calcined powder and that the firing temperature was changed to 980° C. Additionally, the multilayer piezoelectric elements pertaining to Example 10 were manufactured in the same manner as in Example 8, except that the quantity of $ZrO_2$ was changed to 1.0 percent by mol relative to 100 percent by mol of the calcined powder. Furthermore, the multilayer piezoelectric elements pertaining to Example 11 were manufactured in the same manner as in Example 5, except that the quantity of $ZrO_2$ was changed to 2.0 percent by mol relative to 100 percent by mol of the calcined powder and that the firing temperature was changed to 1020° C.

[Confirmation of Silver-Segregated Regions in Piezoelectric Ceramic Layer]

When a piezoelectric ceramic layer in one of the multilayer piezoelectric elements obtained in each Example was checked for presence/absence of silver-segregated regions in sintered grains and their long-diameter lengths were measured according to the same methods in Example 1, silver-segregated regions were confirmed in sintered grains in all of the elements, and their long-diameter lengths were all 10 nm or smaller.

[Granularity Distribution Measurement of Sintered Grains in Piezoelectric Ceramic Layer]

When a piezoelectric ceramic layer in one of the multilayer piezoelectric elements obtained in each Example was measured for granularity distribution of sintered grains according to the same method in Example 1, D50 was 550 nm and (D90−D10)/D50 was 1.20 in Example 8, D50 was 800 nm and (D90−D10)/D50 was 1.34 in Example 9, D50 was 1400 nm and (D90−D10)/D50 was 2.1 in Example 10, and D50 was 580 nm and (D90−D10)/D50 was 1.12 in Example 11.

[Electrical Reliability Test]

When the multilayer piezoelectric elements obtained in each Example were evaluated for electrical reliability according to the same method in Example 1, the average lifespan was 890 minutes in Example 8, 1540 minutes in Example 9, 200 minutes in Example 10, and 100 minutes in Example 11.

[Evaluation of Piezoelectric Characteristics]

When one of the multilayer piezoelectric elements obtained in each Example was evaluated for piezoelectric characteristics according to the same method in Example 1, $d^*_{33}$ was 220 pm/V in Example 8, 240 pm/V in Example 9, 235 pm/V in Example 10, and 210 pm/V in Example 11.

With regard to Examples 8 to 11 explained above, the compositions of internal electrodes and sintered body layers are shown in Table 5, while the firing temperatures and confirmed results of properties are shown in Table 6, respectively. In Table 6, the aforementioned results of Example 5 are also shown for ease of understanding of the trends of how the properties change according to the additive quantity of Zr.

TABLE 5

| | Internal electrodes | Composition of calcined powder | Additives (percentage to 100% by mol of calcined powder) |
|---|---|---|---|
| Example 8 | $Ag_{0.9}Pd_{0.1}$ | $Li_{0.064}Na_{0.52}K_{0.42}NbO_3$ | 1.0 mol % $BaCO_3$, 0.2 mol % $ZrO_2$, 0.65 mol % $Li_2CO_3$, 1.3 mol % $SiO_2$, 0.5 mol % MnO |
| Example 9 | | | 1.0 mol % $BaCO_3$, 0.5 mol % $ZrO_2$, 0.65 mol % $Li_2CO_3$, 1.3 mol % $SiO_2$, 0.5 mol % MnO |
| Example 10 | | | 1.0 mol % $BaCO_3$, 1.0 mol % $ZrO_2$, 0.65 mol % $Li_2CO_3$, 1.3 mol % $SiO_2$, 0.5 mol % MnO |
| Example 11 | | | 1.0 mol % $BaCO_3$, 2.0 mol % $ZrO_2$, 0.65 mol % $Li_2CO_3$, 1.3 mol % $SiO_2$, 0.5 mol % MnO |

TABLE 6

| | Firing temperature (° C.) | D50 (nm) | (D90−D10)/D50 | Silver-segregated regions of 10 nm or smaller in long diameter in sintered grains | Average lifespan (minutes) | $d^*_{33}$ (pm/V) |
|---|---|---|---|---|---|---|
| Example 5 | 1030 | 480 | 0.90 | Yes | 50 | 210 |
| Example 8 | 1010 | 550 | 1.20 | | 890 | 220 |
| Example 9 | 980 | 800 | 1.34 | | 1540 | 240 |
| Example 10 | 1010 | 1400 | 2.10 | | 200 | 235 |
| Example 11 | 1020 | 580 | 1.12 | | 100 | 210 |

When Examples 8 to 11 are compared against Example 5, it can be argued that a multilayer piezoelectric element pertaining to an aspect of the present invention will have improved electrical reliability when $ZrO_2$ is added during manufacturing to make the piezoelectric ceramic layers contain Zr. Additionally, it can be argued that the piezoelectric characteristics will also improve when $ZrO_2$ is added to the calcined powder by up to approx. 1.0 percent by mol, or specifically up to a quantity equivalent to that of at least one type of alkaline earth metal selected from calcium and barium. These phenomena are presumably attributable to the inhibition, by an introduction of the quadrivalent cation $Zr^{4+}$ to the B site, of oxygen deficiency that would otherwise occur from a higher additive quantity of alkaline earth metal.

Examples 12 to 15

[Manufacturing of Multilayer Piezoelectric Elements]

The multilayer piezoelectric elements pertaining to Example 12 were manufactured in the same manner as in Example 2, except that the quantities of $Li_2CO_3$ and $SiO_2$ to be added to the calcined powder of alkaline niobate were changed to 0.4 percent by mol and 0.8 percent by mol, respectively, relative to 100 percent by mol of the calcined powder and that the firing temperature of the laminated body was changed to 940° C. Also, the multilayer piezoelectric elements pertaining to Example 13 were manufactured in the same manner as in Example 2, except that the quantities of $Li_2CO_3$ and $SiO_2$ were changed to 1.5 percent by mol and 3.0 percent by mol, respectively, relative to 100 percent by mol of the calcined powder and that the firing temperature was changed to 930° C. Additionally, the multilayer piezoelectric elements pertaining to Example 14 were manufactured in the same manner as in Example 13, except that the quantities of $Li_2CO_3$ and $SiO_2$ were changed to 0.4 percent by mol and 2.0 percent by mol, respectively, relative to 100 percent by mol of the calcined powder. Furthermore, the multilayer piezoelectric elements pertaining to Example 15 were manufactured in the same manner as in Example 2, except that the quantities of $Li_2CO_3$ and $SiO_2$ were changed to 1.5 percent by mol and 0.4 percent by mol, respectively, relative to 100 percent by mol of the calcined powder and that the firing temperature was changed to 950° C.

[Confirmation of Silver-Segregated Regions in Piezoelectric Ceramic Layer]

When a piezoelectric ceramic layer in one of the multilayer piezoelectric elements obtained in each Example was checked for presence/absence of silver-segregated regions in sintered grains and their long-diameter lengths were measured according to the same methods in Example 1, silver-segregated regions were confirmed in sintered grains in all of the elements, and their long-diameter lengths were all 10 nm or smaller.

[Granularity Distribution Measurement of Sintered Grains in Piezoelectric Ceramic Layer]

When a piezoelectric ceramic layer in one of the multilayer piezoelectric elements obtained in each Example was measured for granularity distribution of sintered grains according to the same method in Example 1, D50 was 520 nm and (D90−D10)/D50 was 0.85 in Example 12, D50 was 480 nm and (D90−D10)/D50 was 0.92 in Example 13, D50 was 490 nm and (D90−D10)/D50 was 1.20 in Example 14, and D50 was 720 nm and (D90−D10)/D50 was 1.60 in Example 15.

[Electrical Reliability Test]

When the multilayer piezoelectric elements obtained in each Example were evaluated for electrical reliability according to the same method in Example 1, the average lifespan was 2200 minutes in Example 12, 2150 minutes in Example 13, 2600 minutes in Example 14, and 280 minutes in Example 15.

[Evaluation of Piezoelectric Characteristics]

When one of the multilayer piezoelectric elements obtained in each Example was evaluated for piezoelectric characteristics according to the same method in Example 1, $d^*_{33}$ was 195 pm/V in Example 12, 200 pm/V in Example 13, 180 pm/V in Example 14, and 210 pm/V in Example 15.

With regard to Examples 12 to 15 explained above, the compositions of internal electrodes and sintered body layers are shown in Table 7, while the firing temperatures and confirmed results of properties are shown in Table 8, respectively. In Table 8, the aforementioned results of Example 2 are also shown for ease of understanding of the trends of how the properties change according to the total additive quantity of Li and Si and their ratio.

TABLE 7

| | Internal electrodes | Composition of calcined powder | Additives (percentage to 100% by mol of calcined powder) |
|---|---|---|---|
| Example 12 | $Ag_{0.9}Pd_{0.1}$ | $Li_{0.064}Na_{0.52}K_{0.42}NbO_3$ | 0.5 mol % $BaCO_3$, 0.4 mol % $Li_2CO_3$, 0.8 mol % $SiO_2$, 0.5 mol % MnO |
| Example 13 | | | 0.5 mol % $BaCO_3$, 1.5 mol % $Li_2CO_3$, 3.0 mol % $SiO_2$, 0.5 mol % MnO |
| Example 14 | | | 0.5 mol % $BaCO_3$, 0.4 mol % $Li_2CO_3$, 2.0 mol % $SiO_2$, 0.5 mol % MnO |
| Example 15 | | | 0.5 mol % $BaCO_3$, 1.5 mol % $Li_2CO_3$, 0.4 mol % $SiO_2$, 0.5 mol % MnO |

TABLE 8

| | Firing temperature (° C.) | D50 (nm) | (D90−D10)/D50 | Silver-segregated regions of 10 nm or smaller in long diameter in sintered grains | Average lifespan (minutes) | $d^*_{33}$ (pm/V) |
|---|---|---|---|---|---|---|
| Example 2 | 1030 | 680 | 1.20 | Yes | 1200 | 225 |
| Example 12 | 940 | 520 | 0.85 | | 2200 | 195 |
| Example 13 | 930 | 480 | 0.92 | | 2150 | 200 |
| Example 14 | 930 | 490 | 1.20 | | 2600 | 180 |
| Example 15 | 950 | 720 | 1.60 | | 280 | 210 |

From the obtained results, it can be argued that a multilayer piezoelectric element pertaining to an aspect of the present invention will allow for lowering of the firing temperature when appropriate quantities of $Li_2CO_3$ and $SiO_2$ are added during manufacturing. Additionally, the reason why multilayer piezoelectric elements offering high electrical reliability were obtained is presumably because the generation of compounds containing Li and Si and having high electrical insulating property, combined with the sintered grains becoming finer due to a lower firing temperature, allowed the electrical insulating property of the piezoelectric ceramic layers to improve. Particularly in Example 14 where the ratio by mol of Si to Li, or Si/Li, is higher than in the other Examples, a multilayer piezoelectric element having notably excellent electrical reliability was obtained presumably because Si-rich compounds having high electrical insulating property were generated.

It should be noted that, in Example 2, firing was performed at a temperature near the melting point of the internal electrodes in order to obtain dense sintered body layers with certainty, and it does not mean dense sintered body layers will not generate when firing is performed at a lower temperature.

Examples 16 to 18

[Manufacturing of Multilayer Piezoelectric Elements]

The multilayer piezoelectric elements pertaining to Example 16 were manufactured in the same manner as in Example 2, except that the quantity of MnO to be added to the calcined powder of alkaline niobate was changed to 0.2 percent by mol relative to 100 percent by mol of the calcined powder and that the firing temperature of the laminated body was changed to 1040° C. Also, the multilayer piezoelectric elements pertaining to Example 17 were manufactured in the same manner as in Example 2, except that the quantity of MnO was changed to 1.0 percent by mol relative to 100 percent by mol of the calcined powder and that the firing temperature was changed to 1010° C. Furthermore, the multilayer piezoelectric elements pertaining to Example 18 were manufactured in the same manner as in Example 2, except that the quantity of MnO was changed to 2.0 percent by mol relative to 100 percent by mol of the calcined powder and that the firing temperature was changed to 990° C.

[Confirmation of Silver-Segregated Regions in Piezoelectric Ceramic Layer]

When a piezoelectric ceramic layer in one of the multilayer piezoelectric elements obtained in each Example was checked for presence/absence of silver-segregated regions in sintered grains and their long-diameter lengths were measured according to the same methods in Example 1, silver-segregated regions were confirmed in sintered grains in all of the elements, and their long-diameter lengths were all 10 nm or smaller.

[Granularity Distribution Measurement of Sintered Grains in Piezoelectric Ceramic Layer]

When a piezoelectric ceramic layer in one of the multilayer piezoelectric elements obtained in each Example was measured for granularity distribution of sintered grains according to the same method in Example 1, D50 was 820 nm and (D90−D10)/D50 was 1.40 in Example 16, D50 was 510 nm and (D90−D10)/D50 was 1.00 in Example 17, and D50 was 450 nm and (D90−D10)/D50 was 0.85 in Example 18.

[Electrical Reliability Test]

When the multilayer piezoelectric elements obtained in each Example were evaluated for electrical reliability according to the same method in Example 1, the average lifespan was 950 minutes in Example 16, 1560 minutes in Example 17, and 1610 minutes in Example 18.

[Evaluation of Piezoelectric Characteristics]

When one of the multilayer piezoelectric elements obtained in each Example was evaluated for piezoelectric characteristics according to the same method in Example 1, $d^*_{33}$ was 220 pm/V in Example 16, 185 pm/V in Example 17, and 170 pm/V in Example 18.

With regard to Examples 16 to 18 explained above, the compositions of internal electrodes and sintered body layers are shown in Table 9, while the firing temperatures and confirmed results of properties are shown in Table 10, respectively. In Table 10, the aforementioned results of Example 2 are also shown for ease of understanding of the trends of how the properties change according to the additive quantity of Mn.

TABLE 10

| | Firing temperature (° C.) | D50 (nm) | (D90−D10)/D50 | Silver-segregated regions of 10 nm or smaller in long diameter in sintered grains | Average lifespan (minutes) | $d^*_{33}$ (pm/V) |
|---|---|---|---|---|---|---|
| Example 16 | 1040 | 820 | 1.40 | Yes | 950 | 220 |
| Example 2 | 1030 | 680 | 1.20 | | 1200 | 225 |
| Example 17 | 1010 | 510 | 1.00 | | 1560 | 185 |
| Example 18 | 990 | 450 | 0.85 | | 1610 | 170 |

From the obtained results, it can be argued that a multilayer piezoelectric element pertaining to an aspect of the present invention will have higher electrical reliability when an appropriate quantity of MnO is added during manufacturing. Presumably this is attributable to Mn generating an oxide of high electrical resistance in the sintered body layers, thereby improving the electrical resistance of the piezoelectric ceramic layers.

INDUSTRIAL APPLICABILITY

According to the present invention, a multilayer piezoelectric element using an alkaline niobate-based piezoelectric ceramic can be provided at low cost. Such multilayer piezoelectric element contains no lead as a constitutive component and thus can reduce environmental burdens throughout its lifecycle, which is useful. Additionally, the multilayer piezoelectric element has a high content percentage of silver in the internal electrodes and thus is low in electrical resistivity and can reduce electrical loss during use, which is also useful. Furthermore, according to preferred modes of the present invention, multilayer piezoelectric elements having desired properties can be obtained by allowing various types of additive elements to be contained in the piezoelectric ceramic layers, which is also useful.

We claim:

1. A multilayer piezoelectric element characterized by comprising:
   piezoelectric ceramic layers that are:
      constituted by a piezoelectric ceramic whose primary component is an alkaline niobate having a perovskite structure and which contains at least one type of alkaline earth metal selected from calcium and barium, as well as silver, wherein a total content of the alkaline earth metal is 0.2 percent by mol or higher but lower than 2.0 percent by mol when an element content in B sites of the alkaline niobate represents 100 percent by mol; and
      each containing at least one sintered grain identified as a grain having silver-segregated regions inside the grain, wherein the silver-segregated regions are regions where silver is segregated and identified as

TABLE 9

| | Internal electrodes | Composition of calcined powder | Additives (percentage to 100% by mol of calcined powder) |
|---|---|---|---|
| Example 16 | $Ag_{0.9}Pd_{0.1}$ | $Li_{0.064}Na_{0.52}K_{0.42}NbO_3$ | 0.5 mol % $BaCO_3$, 0.65 mol % $Li_2CO_3$, 1.3 mol % $SiO_2$, 0.2 mol % MnO |
| Example 17 | | | 0.5 mol % $BaCO_3$, 0.65 mol % $Li_2CO_3$, 1.3 mol % $SiO_2$, 1.0 mol % MnO |
| Example 18 | | | 0.5 mol % $BaCO_3$, 0.65 mol % $Li_2CO_3$, 1.3 mol % $SiO_2$, 2.0 mol % MnO | islands on elemental analysis, said silver-segregated regions having a long diameter of 10 nm or smaller; and internal electrodes that are placed between the piezoelectric ceramic layers and formed by a metal whose silver content is 80 percent by mass or higher.

2. The multilayer piezoelectric element according to claim 1, wherein the piezoelectric ceramic layers each contain at least one sintered grain having at least five locations inside that correspond to the silver-segregated regions.

3. The multilayer piezoelectric element according to claim 1, wherein the alkaline niobate is expressed by Composition Formula (1) below:

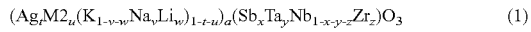

$$(Ag_tM2_u(K_{1-v-w}Na_vLi_w)_{1-t-u})_a(Sb_xTa_yNb_{1-x-y-z}Zr_z)O_3 \quad (1)$$

wherein M2 represents the alkaline earth metal, while t, u, v, w, x, y, z, and a represent values satisfying inequalities expressed by $0.005 < t \le 0.05$, $0.002 \le u < 0.02$, $0.007 < t+u < 0.07$, $0 \le v \le 1$, $0.02 < w \le 0.1$, $0.02 < v+w \le 1$, $0 \le x \le 0.1$, $0 \le y \le 0.4$, $0 \le z \le 0.02$, and $1 < a \le 1.1$, respectively.

4. The multilayer piezoelectric element according to claim 1, wherein the piezoelectric ceramic layers further contain Li and Si other than constituent elements of the alkaline niobate, wherein a content of Li is 0.1 percent by mol or higher but no higher than 3.0 percent by mol, while a content of Si is 0.1 percent by mol or higher but no higher than 3.0 percent by mol, when the alkaline niobate represents 100 percent by mol.

5. The multilayer piezoelectric element according to claim 1, wherein $Li_3NbO_4$ has precipitated in the piezoelectric ceramic layers.

6. The multilayer piezoelectric element according to claim 4, wherein at least one type of compound selected from alkaline silicate compounds and alkaline niobate silicate compounds has precipitated in the piezoelectric ceramic layers.

7. The multilayer piezoelectric element according to claim 1, wherein the piezoelectric ceramic layers further contain Mn other than constituent elements of the alkaline niobate, wherein a content of Mn is 2.0 percent by mol or lower when the alkaline niobate represents 100 percent by mol.

8. The multilayer piezoelectric element according to claim 7, wherein an oxide containing manganese has precipitated in the piezoelectric ceramic layers.

9. The multilayer piezoelectric element according to claim 1, wherein diameters of the sintered grains in the piezoelectric ceramic layers satisfy "100 nm ≤ D50 ≤ 800 nm" AND "(D90−D10)/D50 ≤ 2.0".

10. The multilayer piezoelectric element according to claim 1, further provided with protective parts that cover the internal electrodes and/or piezoelectric ceramic layers.

11. The multilayer piezoelectric element according to claim 1, wherein the layers of the internal electrodes are electrically connected alternately via a pair of external electrodes provided on a surface.

12. The multilayer piezoelectric element according to claim 1, wherein no sintered grains that have silver-segregated regions having a long diameter of more than 10 nm are observed on elemental analysis.

13. The multilayer piezoelectric element according to claim 1, wherein no sintered grains that have silver-segregated regions having a long diameter of more than 5 nm are observed on elemental analysis.

* * * * *